US011870142B2

(12) United States Patent
Swernofsky et al.

(10) Patent No.: US 11,870,142 B2
(45) Date of Patent: Jan. 9, 2024

(54) TILE TO TILE RF GROUNDING

(71) Applicant: Raytheon Company, Waltham, MA (US)

(72) Inventors: Dave E. Swernofsky, Richardson, TX (US); Robert S. Isom, Allen, TX (US)

(73) Assignee: Raytheon Company, Waltham, MA (US)

( * ) Notice: Subject to any disclaimer, the term of this patent is extended or adjusted under 35 U.S.C. 154(b) by 223 days.

(21) Appl. No.: 17/477,860

(22) Filed: Sep. 17, 2021

(65) Prior Publication Data

US 2023/0092709 A1    Mar. 23, 2023

(51) Int. Cl.
*H01Q 21/00* (2006.01)
*H01Q 1/48* (2006.01)
*H01R 25/00* (2006.01)
*H05K 5/00* (2006.01)
*H01L 25/10* (2006.01)
*H01R 13/03* (2006.01)

(52) U.S. Cl.
CPC ........... *H01Q 1/48* (2013.01); *H01Q 21/0025* (2013.01); *H01R 25/006* (2013.01); *H05K 5/0021* (2013.01); *H01L 25/105* (2013.01); *H01R 13/03* (2013.01)

(58) Field of Classification Search
CPC ............. H01Q 21/065; H01Q 21/0025; H01Q 21/0087; H01Q 1/48–52; H01Q 3/26–30; H01Q 23/00; H05K 5/0021
See application file for complete search history.

(56) References Cited

U.S. PATENT DOCUMENTS

| | | |
|---|---|---|
| 4,208,642 A | 6/1980 | Saunders |
| 6,411,523 B1 | 6/2002 | Roberson et al. |
| 7,646,355 B2 | 1/2010 | Bishop |
| 8,525,729 B1 | 9/2013 | Martin |

(Continued)

OTHER PUBLICATIONS

Moussessian et al., "An Electronically Scanned Large Aperture Membrane Array;" Paper from Journal of Physics; Published Jan. 2007; 5 Pages.

(Continued)

*Primary Examiner* — Hasan Islam
(74) *Attorney, Agent, or Firm* — DALY, CROWLEY, MOFFORD & DURKEE, LLP

(57) ABSTRACT

An assembly comprises a first subassembly, a second subassembly, and a conductive grounding element. The first subassembly comprises a first module comprising a first ground plane and a first conductive region in operable communication with the first ground plane. The second subassembly comprises a second module comprising a second ground plane distinct from the first ground plane and a second conductive region in operable communication with the second ground plane. The first and second subassemblies attach to each other along a seam. The conductive grounding element comprises an electrically conductive material including a first portion disposed adjacent to the first conductive region and a second portion disposed adjacent the second conductive region. The conductive grounding element is configured to fill one or more gaps in the seam and to operably couple together the first and second ground planes of the first and second subassemblies into a third common ground plane.

20 Claims, 14 Drawing Sheets

(56) References Cited

U.S. PATENT DOCUMENTS

| | | |
|---|---|---|
| 8,816,929 B2 | 8/2014 | Kam et al. |
| 9,172,145 B2 | 10/2015 | Puzella et al. |
| 9,685,707 B2 * | 6/2017 | Crockett, Jr. ...... H01Q 21/0006 |
| 9,942,975 B2 | 4/2018 | Elliott et al. |
| 2017/0054221 A1 | 2/2017 | West et al. |
| 2020/0058986 A1 | 2/2020 | Dorsey |

OTHER PUBLICATIONS

Park et al., "Edge Plating for Building Large Arrays and Low-Inductance Board-to-Board Connection;" IEICE Electronics Express, vol. 15, No. 24; Published Nov. 29, 2018; 11 Pages.

PCT International Search Report and Written Opinion dated Nov. 22, 2022 for International Application No. PCT/US2022/038335; 13 Pages.

* cited by examiner

| Mfg | Series | Part Numbers | Description/comments |
|---|---|---|---|
| Tech-Etch | 2400 | 2461-1011-0169<br>2461-1011-0158 | Nickel-plating over highly conductive copper plated substrate; open celled polyurethane foam core |
| Tech-Etch | 2000 | 2010-2011-0016<br>2010-2021-0016<br>2010-2041-0016<br>2010-2051-0016 | Knitted wire mesh exterior with an elastomer core ; optional pressure sensitive adhesive (PSA) |
| Tech-Etch | 2000 | 2010-2001-0016 | Knitted wire mesh exterior with a mesh core; optional PSA |
| Tech-Etch | 4000 | 4010-2031-0062*<br>4010-5031-0062* | "Multishield" Composite material: wire matrix embedded in silicone rubber, aligned perpendicular to contact surfaces |
| Tech-Etch | 5000 | 5013-2050-0001 | "Monoshield" Fine monel/aluminum impregnated with 50 durometer silicone rubber |
| Tech-Etch | 1000 | TBD | "Supershield" - Silicone elastomer filled with conductive metal particles; compression deflection 2.5 - 8% |
| Tech-Etch | 2700 | 2710-1011-0001-040*<br>2710-1011-0001-059* | Conductive open cell polyurethane foam, with nickel over copper plated polyester fabric on either side; Compression deflection: 2-3 PSI @50% compression |
| Leader Tech | CFS | CFS1919060* | Nickel-copper polyurethane foam layered between two pieces of conductive polyester fabric; conductive PSA adhesive; 2.1 PSI @30% compression typical |

*FIG. 13*

TILE TO TILE RF GROUNDING

FIELD OF THE INVENTION

Embodiments of the disclosure generally relate to devices, systems, and methods for electrical coupling and radio frequency (RF) grounding between components. More particularly, the disclosure describes embodiments relating to devices, systems, and methods for providing a high frequency RF ground across physical boundaries between modules such as tiled sub arrays of antennas.

BACKGROUND

Common antenna arrays for radar systems can include and AESA (active electronically scanned array) antennas, as is known in the art. Typically, the basic building block of a conventional AESA is the Transmit/Receive module or TR module, which can be packaged to form an AESA antenna element, and may include a radiator, receiver Low Noise Amplifier (LNA), transmit Power Amplifier (PA), and digitally controlled phase or delay and gain components. Several of these TR modules are placed on antenna panels in a grid format for transmitting and receiving radar signals. Digital control of the transmit/receive gain and phase allows an AESA antenna to steer or point the resultant antenna beam without physically moving the antenna panel. Exemplary low cost AESA antenna panels employ printed circuit radiators connected to surface mount Monolithic Microwave Integrated Circuit (MMIC) devices that contain the LNA, PA and phase/gain control circuitry, all on a single printed circuit board (PCB).

One architecture used for phased array antennas is the so-called "panel" or "tile" architecture. With a tile architecture, the RF circuitry and signals are distributed in a plane that is parallel to a plane defined by the antenna aperture. The tile architecture uses basic building blocks in the form of "tiles" wherein each tile can be formed of a multi-layer printed circuit board structure including antenna elements and its associated RF circuitry encompassed in an assembly, and wherein each antenna tile can operate by itself as a substantially planar phased array or as a sub-array of a much larger array antenna.

For an exemplary phased array having a tile architecture, each tile can be a highly integrated assembly that incorporates a radiator, a transmit/receive (T/R) channel, RF and power manifolds and control circuitry, all of which can be combined into a low cost light-weight assembly for implementing AESA. Such an architecture can be particularly advantageous for applications where reduced weight and size of the antenna are important to perform the intended mission (e.g., airborne or space applications) or to transport and deploy a tactical antenna at a desired location.

SUMMARY

The following presents a simplified summary in order to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

Embodiments are provided that help to address problems and challenges, such as performance and antenna pattern issues, that can arise when integrating multiple RF subarray tiles into a single array, especially at millimeter wave frequencies. In certain embodiments, some of the solution includes designs enabling a reliable, continuous, RF ground across physical sub-array boundaries, where the ground is mechanically and electrically configured to compensate for manufacturing and assembly tolerance variations, is serviceable to enable repair and replacement, supports small lattice spacing, helps maintain element spacing continuity, provides a shorter ground loop path, increases RF sensitivity, minimizes RF losses, and provides numerous additional advantages, as will be appreciated by those of skill in the art.

In one aspect, an assembly is provided, the assembly comprising a first subassembly, a second subassembly, and a conductive grounding element. The first subassembly comprises a first support structure operably coupled to a first module, the first module comprising a respective first ground plane, wherein the first module comprises at least a first conductive region in operable communication with the respective first ground plane. The second subassembly comprises a second support structure operably coupled to a second module comprising a respective second ground plane distinct from the first ground plane, wherein the second module comprises at least a second conductive region in operable communication with the second ground plane, wherein the first and second subassemblies are configured to attach to each other along a seam. The conductive grounding element is configured to operably couple together the first and second ground planes of the first and second subassemblies into a third common ground plane, the conductive grounding element comprising an electrically conductive material that includes a first portion disposed adjacent to a first region of the first support structure and adjacent to the first conductive region and a second portion disposed adjacent to a first region of the second support structure and adjacent to the second conductive region, wherein the conductive grounding element is configured to fill one or more gaps in the seam between the first and second subassemblies.

In one embodiment, the gap filling is configured to minimize a length of a grounding path between the first and second ground planes. In one embodiment, the conductive grounding element is configured to be in compressive contact with the first region of the first support structure, the second region of the second support structure, the first conductive region, and the second conductive region. In one embodiment, the conductive grounding element comprises at least one of a compressible electrically conductive material and a conductive polymer material.

In one embodiment, at least one of the first and second modules comprises a plurality of antenna elements. In one embodiment, the plurality of antenna elements is arranged in a first lattice pattern having a first spacing and wherein the conductive grounding element is configured to maintain a continuity of the first spacing across the seam.

In one embodiment, the first portion and the second portion of the conductive grounding element comprise distinct and separate structures that are configured to be in operable mechanical and electrical communication when the first subassembly, second subassembly, and conductive grounding element, are assembled together into the assembly. In one embodiment, the first subassembly comprises a first antenna tile and the second subassembly comprises a second antenna tile. In one embodiment, at least one of the first and second subassemblies comprises an opening and wherein the conductive grounding element has at least a portion configured to mate to the aperture so as to enable secure attachment of the conductive grounding element to at least one of the first and second subassemblies.

In another aspect, a method is provided. A first subassembly is provided, the first subassembly comprising a first support structure operably coupled to a first module, the first module comprising a respective first ground plane, wherein the first module comprises at least a first conductive region in operable communication with the respective first ground plane. A second subassembly is provided, the second subassembly comprising a second support structure operably coupled to a second module comprising a respective second ground plane distinct from the first ground plane, wherein the second module comprises at least a second conductive region in operable communication with the second ground plane, wherein the first and second subassemblies are configured to attach to each other along a seam. The first and second subassemblies are coupled together using a conductive grounding element configured to operably couple together the first and second ground planes of the first and second subassemblies into a third common ground plane, the conductive grounding element comprising an electrically conductive material that includes a first portion disposed adjacent to a first region of the first support structure and adjacent to the first conductive region and a second portion disposed adjacent to a first region of the second support structure and adjacent to the second conductive region, wherein the conductive grounding element is configured to fill one or more gaps in the seam between the first and second subassemblies.

In one embodiment, the method further comprises configuring the conductive grounding element to minimize a length of a grounding path between the first and second ground planes. In one embodiment, at least one of the first and second modules comprises a plurality of antenna elements arranged in a first lattice pattern having a first spacing, wherein the conductive grounding element is configured to maintain a continuity of the first spacing across the seam. In one embodiment, the conductive grounding element is configured to be in compressive contact with the first region of the first support structure, the second region of the second support structure, the first conductive region, and the second conductive region. In one embodiment, the conductive grounding element comprises at least one of a compressible electrically conductive material and a conductive polymer material.

In one embodiment, the method further comprises applying compression to the conductive grounding element, wherein the compression is configured to deform a shape of the conductive grounding element enough to cause the first portion to make electrical contact with the first region and to cause the second portion to make electrical contact with the second region, whereby the first ground plane and second ground plane are coupled together into the third common ground plane.

In another aspect, an assembly is provided, the assembly comprising a first subassembly, a second subassembly, and a conductive grounding element. The first subassembly comprises a first module having a respective first ground plane, wherein the first module comprises at least a first conductive region in operable communication with the respective first ground plane. The second subassembly comprises a second module having a respective second ground plane distinct from the first ground plane, wherein the second module comprises at least a second conductive region in operable communication with the second ground plane, wherein the first and second subassemblies are configured to attach to each other along a seam. The conductive grounding element is configured to operably couple together the first and second ground planes of the first and second subassemblies into a third common ground plane, the conductive grounding element comprising an electrically conductive material that includes a first portion disposed adjacent to the first conductive region and a second portion disposed adjacent the second conductive region, wherein the conductive grounding element is configured to fill one or more gaps in the seam between the first and second subassemblies.

In one embodiment, the gap filling is configured to minimize a length of a grounding path between the first and second ground planes. In one embodiment, the first and second modules each comprise a respective plurality of antenna elements is arranged in a first lattice pattern having a first spacing and wherein the conductive grounding element is configured to maintain a continuity of the first spacing across the seam. In one embodiment, at least one of the first and second subassemblies comprises an opening and wherein the conductive grounding element has at least a portion configured to mate to the aperture so as to enable secure attachment of the conductive grounding element to at least one of the first and second subassemblies. In one embodiment, the conductive grounding element comprises at least one of a dispensed conductive material, a conductive polymer material, and a compressible conductive material.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which:

FIG. 13 is an overview table of exemplary usable materials for a conductive grounding element usable with at least the embodiments of FIGS. 1-13, in accordance with one embodiment;

The drawings are not to scale, emphasis instead being on illustrating the principles and features of the disclosed embodiments. In addition, in the drawings, like reference numbers indicate like elements.

DETAILED DESCRIPTION

Figure 1:
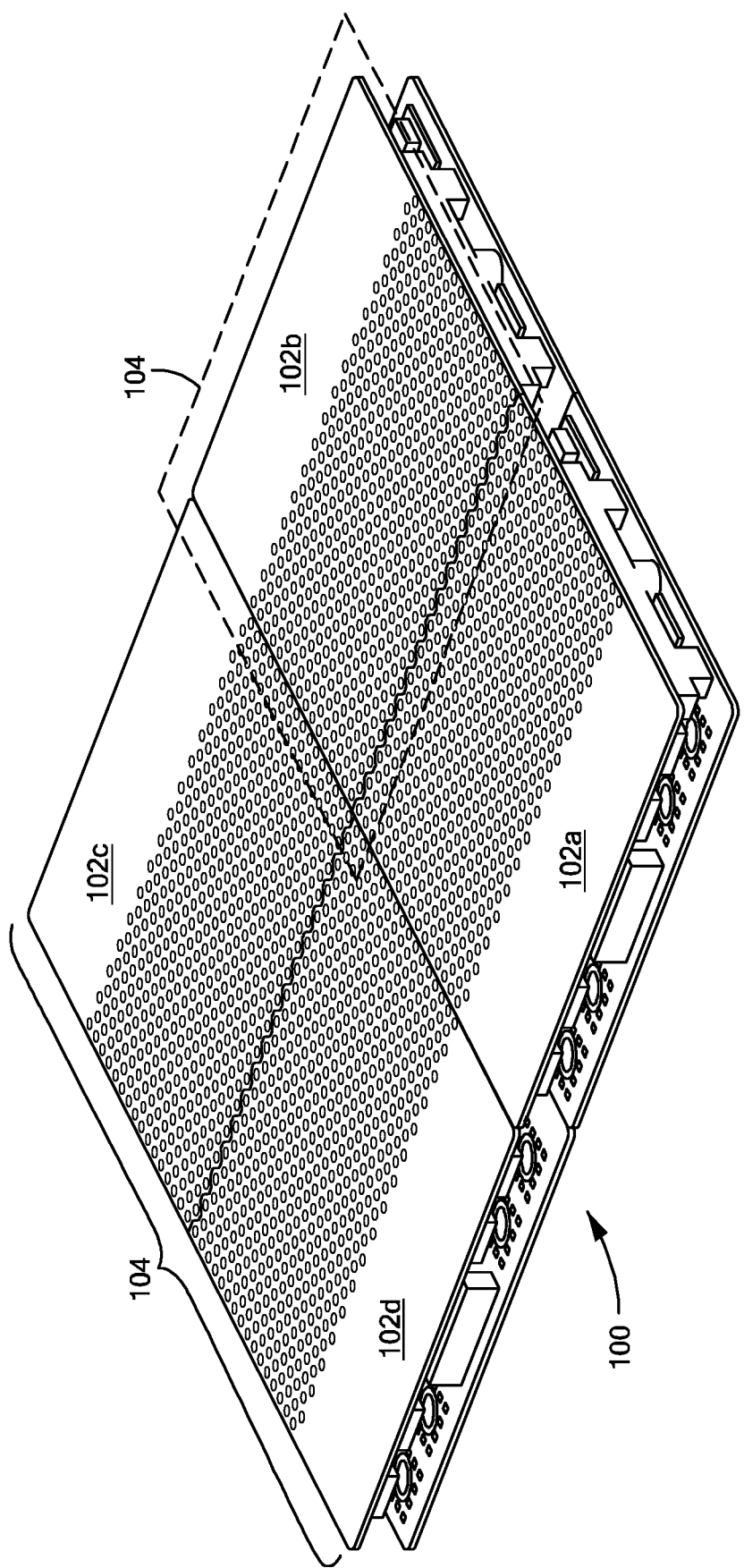
FIG. 1 is a perspective view of an exemplary 2048 (2K) element radiofrequency (RF) array made using four 512 element tiles, in accordance with one embodiment.

In connection with describing in detail the particular systems, devices, and methods in the embodiments provided herein, note that the concepts disclosed herein include, but are not limited to various structural combination of components and circuits, but are not necessarily limited to the particular detailed configurations thereof. Furthermore, the structures, methods, functions, control and arrangement of system elements, including but not limited to components and circuits, are in some instances illustrated in the drawings by simplified block representations, schematic diagrams, and other views, to avoid obscuring the disclosure with structural details which will be readily apparent to those skilled in the art having the benefit of the description herein.

The following detailed description is provided, in at least some examples, using the specific context of antenna arrays, e.g., those used with radar systems, communications systems, sensor systems, cellular networks, etc. At least some embodiments are usable with any type of circuit where high frequency circuits and systems are being integrated and/or coupled together, with tight spacing, where a reliable RF ground is needed.

Before describing the various embodiments, some introductory concepts and terminology are explained. A "panel array" (or more simply "panel") refers to a multilayer printed wiring board (PWB) which includes an array of antenna elements (or more simply "radiating elements" or "radiators"), as well as RF, logic and DC distribution circuits in one highly integrated PWB. A panel is also sometimes referred to herein as a tile array (or more simply, a "tile"). In at least some embodiments, a tile can correspond to other types of components, such as a sub-array, and RF circuit card assembly (CCA), and/or any type of RF system or subsystem that needs to be joined to another RF system or subsystem, with a common RF ground, wherein there can be a need to be able to compensate for physical variations along the seam, joint, or other connection point, where these physical variations can adversely impact the RF grounding.

An array antenna may be provided from a single panel (or tile) or from a plurality of panels. In the case where an array antenna is provided from a plurality of panels, a single one of the plurality of panels is sometimes referred to herein as a "panel sub-array" (or a "tile sub-array"). Reference is sometimes made herein to an array antenna having a particular number of panels. It should of course, be appreciated that an array antenna may be comprised of any number of panels and that one of ordinary skill in the art will appreciate how to select the particular number of panels to use in any particular application; the examples provided herein should not be construed as limiting.

In addition, reference is sometimes made herein to a panel or an array antenna having a particular array shape and/or physical size or a particular number of antenna elements. One of ordinary skill in the art will appreciate that the techniques described herein are applicable to various sizes and shapes of panels and/or array antennas and that any number of antenna elements may be used. Similarly, reference is sometimes made herein to panel or tile sub-arrays having a particular geometric shape (e.g., square, rectangular, round) and/or size (e.g., a particular number of antenna elements) or a particular lattice type or spacing of antenna elements. One of ordinary skill in the art will appreciate that the techniques described herein are applicable to various sizes and shapes of array antennas as well as to various sizes and shapes of panels (or tiles) and/or panel sub-arrays (or tile sub-arrays).

Although the description provided herein below describes the embodiments in the context of an array antenna having a substantially square or rectangular shape and comprised of a plurality of tile sub-arrays having a substantially square or rectangular-shape, those of ordinary skill in the art will appreciate that the concepts equally apply to other sizes and shapes of array antennas and panels (or tile sub-arrays) having a variety of different sizes, shapes, and types of antenna elements. Also, the panels (or tiles) may be arranged in a variety of different lattice arrangements including, but not limited to, periodic lattice arrangements or configurations (e.g., rectangular, circular, equilateral or isosceles triangular and spiral configurations) as well as non-periodic or other geometric arrangements including arbitrarily shaped array geometries.

Reference is also sometimes made herein to the array antenna including an antenna element of a particular type, size and/or shape. For example, one type of radiating element is a so-called patch antenna element having a square shape and a size compatible with operation at a particular frequency (e.g., 10 GHz) or range of frequencies (e.g., the X-band frequency range). Another type of radiating element can have a circular shape. So-called "stacked patch" antenna elements also are known. Those of ordinary skill in the art will recognize, of course, that other shapes and types of antenna elements (e.g., an antenna element other than a stacked patch antenna element) may also be used and that the size and/or shape of one or more antenna elements may be selected for operation at any frequency in the RF frequency range (e.g., any frequency in the range of about 1 GHz to about 100 GHz). The types of radiating elements which may be used in the antenna of the present invention include but are not limited to notch elements, dipoles, slots or any other antenna element (regardless of whether the element is a printed circuit element) known to those of ordinary skill in the art.

It should also be appreciated that the antenna elements in each panel or tile sub-array can be provided having any one of a plurality of different antenna element lattice arrangements including periodic lattice arrangements (or configurations) such as rectangular, square, triangular (e.g., equilateral or isosceles triangular), and spiral configurations as well as non-periodic or arbitrary lattice arrangements. Further, as is understood in the art, higher frequencies require tighter lattice spacing between the active elements, which leaves less room for the active circuitry. This becomes even tighter when $\lambda/2$ (half wavelength at transmitted frequency) spacing is required for a wide scan angle.

Applications of at least some embodiments of the panel array (a/k/a tile array) architectures described herein include, but are not limited to, radar, electronic warfare (EW) and communication systems for a wide variety of applications, including but not limited to ship based, airborne, missile and satellite applications. At least some embodiments of the panels (or tile sub-arrays) described herein can be used as part of a radar system or a communications system. At least some embodiments of the invention are applicable, but not limited to, military, airborne, shipborne, communications, unmanned aerial vehicles (UAV) and/or commercial wireless applications.

The tile sub-arrays to be described hereinbelow can also utilize various components, including features such as embedded circulators; a slot-coupled, polarized egg-crate radiator; a single integrated monolithic microwave integrated circuit (MMIC); and/or a passive radio frequency (RF) circuit architecture. For example, as described further herein, technology described in the following commonly assigned United States patents can be used in whole or in part and/or adapted to be used with at least some embodiments of the tile subarrays described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multi-layer stripline radio frequency circuits and interconnection methods." Each of the above patents is hereby incorporated herein by reference.

The tile architecture of antenna arrays can present some challenges in implementation, especially at higher frequencies. As is known, antennas used at very high frequencies, such as millimeter-wave ("mm-wave") frequencies, often need to include high-gain characteristics to compensate for propagation losses that can exist at those frequencies. Thus, some antenna arrays used at high frequency are high density arrays, with larger numbers of elements, to help to increase directivity and thereby focus the radiated power in a given direction. In these arrays, antenna fabrication and performance can be very critical, especially in mm-wave systems, at least in part because of unique characteristics of radio-wave propagation at mm-wave frequencies. Antennas implemented at microwave frequencies can be highly integrated but have reduced tolerance to fabrication errors, resulting in more complex requirements for the materials employed.

Grounding can be another complicating factor for tile arrays at high frequencies. "Grounding" generally refers to the connection (e.g., electrical connection) of a circuit, device, or system to a good conductor that acts as a reference or reference potential plane, creating a low impedance path between the circuit or system and the ground. In an ideal situation, the ground line is an equipotential body that serves as a reference point for the circuit or system potential and is the common conductor of each circuit in a system. Various signal grounding methods are used, including configurations such as single point grounding, multi point grounding, hybrid grounding, and floating grounding.

In single-point grounding, all ground lines of the circuit are connected to a single point. Because grounding often follows a general rule that length of the ground wire should be less than $1/20^{th}$ wavelength of signals used in a system, single point grounding is generally used for systems/circuits having signal frequencies under 1 MHz (where $1/20^{th}$ of the wavelength of 1 MHz is 15 meters). In multi-point grounding, each circuit in a system that needs to be grounded is directly connected to the ground plane closest to that circuit, to achieve shortest possible grounding length and minimize grounding impedance. Multi point grounding is often used for frequencies of 10 MHz and above (e.g., in the tile array systems described herein). Hybrid grounding is a mix of single point and multi point, often used when there are high and low frequency mixing frequencies in a circuit (when a circuit has sections operating at different frequency ranges, e.g., in range of 1-10 MHz). Floating grounding is a type of ground in which the ground doesn't have a physical connection to the earth; rather, the floating ground simply serves as a type of 0V reference line that serves as a return path for current.

Generally, current of any circuit will form a loop through the ground. Further, the ground wire acts as a conductor and has an impedance that is a function of frequency, where higher frequencies result in increasing impedance. At high frequencies like mm-wave frequencies, if the system wavelength is comparable to the length of the system ground lead, the ground line can behave like a short-circuited transmission line.

Multi-point grounding may cause many grounding loops to be formed inside the device or system which can cause ground loop interference in some circuits. In an antenna with two separate tiles, each generating its own pattern, grounding from tile to tile can be less important. However, when multiple antenna tiles work together to create an antenna pattern (e.g., the tiles are all excited together), having a common ground potential between tiles is very important. For example, it is known that, for antenna tiles in arrays, where the grounds are separated, the resultant antenna patterns (made by multiple tiles at once) can become degraded. With grounding between tiles in an array, there is a common potential RF ground loop path, where there can be a huge length before the common potential on one tile "loops around" and joins the common potential on another tiles. Each of these loops can add distance, and added distance, at high frequencies, can result in added impedance, which can create undesirable effects, including signal losses, resonance effects, "suck-outs" (nulls), etc., as will be appreciated by those of skill in the art. Thus, it is preferable, especially at high frequencies, if the distance between a circuit and the common ground be as physically and electrically short as possible. Thus, it is desirable to be able to bridge the ground planes between multiple RF Tile Arrays to create a single aperture and to minimize length of distance between a circuit and ground.

One approach to creating RF grounding across tiled subarrays is to use a variety of metal springs and permanent attachments. They tend to be expensive, difficult to assemble, custom fit, or too large for millimeter wave arrays. Examples of ways to create RF grounding include (but are not limited to) techniques such as:

Spring pins
Leaf-spring EMI seals
Shims
Conductive epoxies
Additional options for low frequency arrays.

A more common solution sometimes can be to avoid creating separate tiles altogether. Instead, in some instance, only the subcomponents are modular. These subcomponents are assembled onto monolithic, continuous, apertures and ground planes. Each monolithic aperture requires much of the same non-recurring engineering (NRE) and lead-time as a fully monolithic array would require.

Various approaches have been considered to provide grounding features. Some approaches attempt to connect ground planes by disposing an antenna element within a metal housing having a ground plane portion with a groove therein, the groove configured to accommodate a conductive O-ring configured to connect neighboring ground planes. However, using a metal housing for each antenna element can add significant cost and weight to CCAs. Other approaches use conductive tape to span seams between adjacent panels. However, use of conductive tape may not be reliable or durable in the long term, especially in military systems, and use of conductive tape to span seams can be problematic at mm-wave frequencies, because limitations in seam accuracy do not scale to mm-wave frequencies. Known approaches with conductive tape generally are able to use it to span a large lattice spacing on a lower frequency device (e.g., L-band, which can have up to ten times the distance between antenna elements as higher-frequency approaches in the mm-wave space, e.g., Q-band). A further approach uses edge plated tiles or subarrays that are soldered edge to edge to ensure ground plane continuity. However, solder can be a less than ideal solution, because solder is inflexible, it cannot be used to fill large gaps, and use of solder can increase cost and complexity of rework, repair, and/or replacement of tiles.

Still other approaches to address grounding concerns can involve monolithic arrays that are designed for each application-specific set of requirements. For example, in some approaches, lattice continuity is provided by either by a monolithic system cold plate or a monolithic radiator. However, with these arrangements, a new, application-specific design is required for each new configuration. Redesign is required in order to implement new technologies, and it can be difficult to repair, replace, and/or upgrade parts of the arrays after they have been fielded. This can mean increased cost of Non-Recurring Expenses (NRE) that are required to design each new configuration of an advanced technology RF Array.

Additional approaches can involve using a support structure that is part of or added to a system (e.g., a structure including but not limited to a system cold plate) as a common ground plane (e.g., for an array of patch elements on a support structure), mounting antenna assemblies directly to a shared common ground plane in a shared enclosure, and joining multiple ground plans internally within a single circuit card assembly (CCA) array.

At least some embodiments provide advantages over known approaches. In certain embodiments, a technique is provided that overcomes at least some issues in the art. For example, one embodiment provides a design for a continuous ground across multiple CCA boundaries that can enable the design and build of scalable RF tile Arrays having a common ground plane across multiple RF tiles, which supports assembly of multiple size and power configurations, and maintains element lattice spacing across multiple RF Tiles. A further embodiment provides a design for creating a continuous ground across the physical boundaries of multiple RF sub-arrays, to enable the design and build of large, scalable and configurable RF Arrays. In some embodiments, the design is implemented by joining radiating circuit card assemblies (CCAs) along the edges of the CCAs, using a material constructed from a substance that is conductive to radio frequency energy, such as a conductive polymer material (RF gasket), which is formed into a conductive grounding element that is applied to a suitable support structure. In at least some embodiments, the conductive grounding element is made from a material that has at least some compressibility, to enable the conductive grounding element to "bridge" various sizes and shapes of gaps between tiles, including gaps having indeterminate or unknown shapes and sizes, e.g., to account for manufacturing tolerances that may vary. In certain embodiments, the gap shape may vary due to board manufacturing tolerances. In certain embodiments, the nominal gap width (discussed further herein) may vary due to board manufacturing tolerances and/or assembly tolerances.

In some embodiments, the material may be commercially available or application specific. Advantageously, in some embodiments the material is selected and tested so that it creates electrical continuity at millimeter wave RF, by compressing between adjacent radiating CCAs and adjacent support structures. Accordingly, the material used for the conductive grounding element compresses to fill gaps and ensure continuous conductive contact and helps provide compliance to manage mechanical assembly tolerances. In addition, the material used for the conductive grounding element is, in at least some embodiments, configured to be serviceable and does not require removal and replacement (R&R) of adjacent tiles during repair of a given tile.

In certain embodiments, techniques are provided to help solve a problem of how to integrate multiple RF subarray (AESAs) tiles to form a single monolithic array, without the usual detrimental impact on RF patterns and performance. At least some embodiments provide a reliable RF ground, across physical subarray boundaries, at high-frequency, while addressing the multiple challenges at mm-wave, including but not limited to:

very small lattice spacing;
high sensitivity to RF losses in small structures;
mechanical tolerances;
Foreign Object Damage (FOD) risk from metal springs; and/or
maintaining lattice spacing continuity across the physical boundaries At least some embodiments provide a design that cost and lead-time competitive design and construction of large, high-frequency, application-specific, RF arrays. This is accomplished by overcoming the challenges that otherwise limit the use of multiple, tiled RF array sub-arrays.

Figure 2:
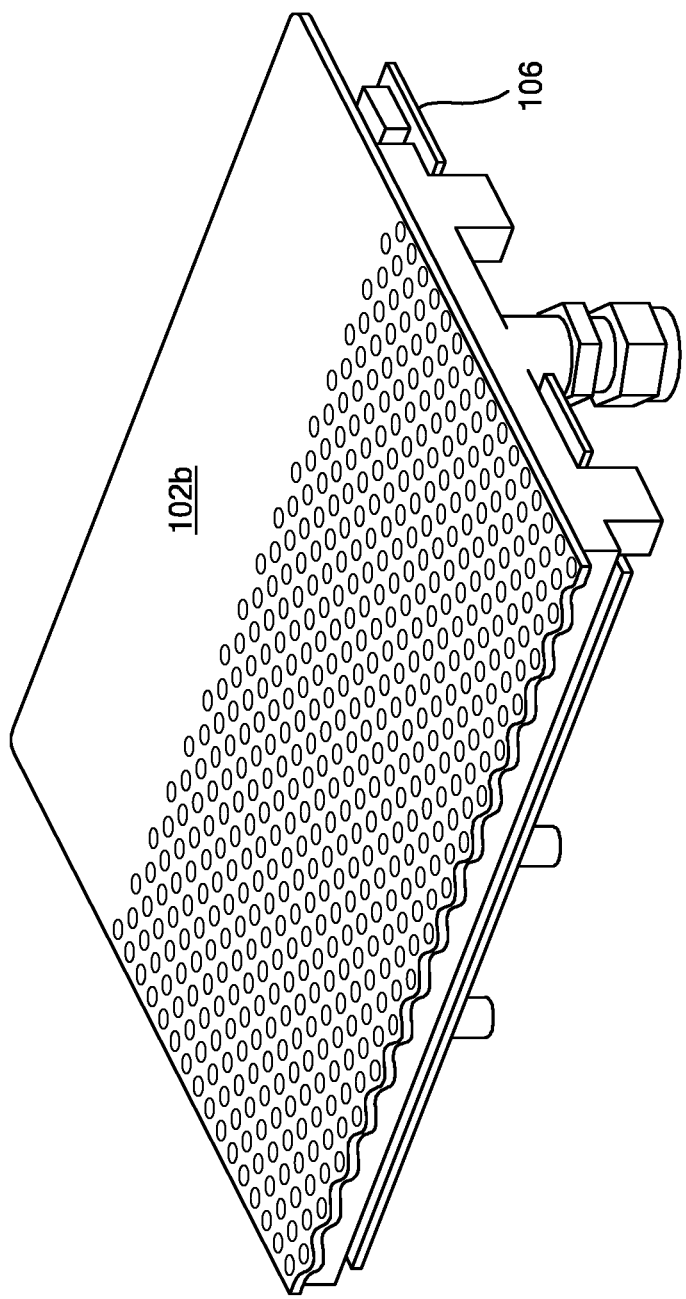
FIG. 2 is a perspective view of one of the 512-element tiles in the RF array of FIG. 1, in accordance with one embodiment.
Figure 3:
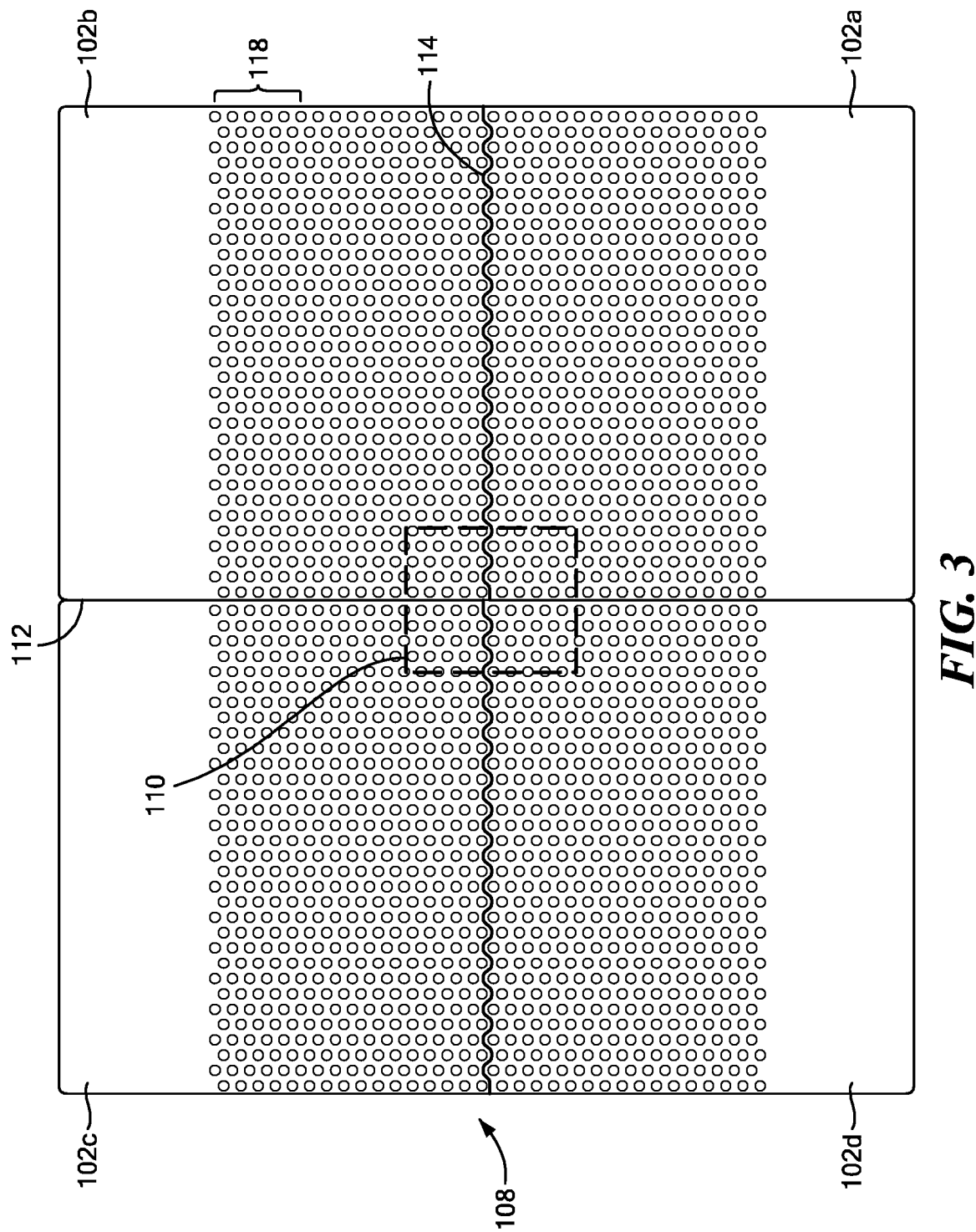
FIG. 3 is a top view of the 2K array of FIG. 1, in accordance with one embodiment.

FIG. 1 is a perspective view of an exemplary 2048 (2K) element, scalable radiofrequency (RF) tile array 100 made using four 512 element tiles 102a-102d, in accordance with one embodiment. FIG. 2 is a perspective view of the enlarged region 104 for one of the 512-element tiles 102b in the RF array 100 of FIG. 1, in accordance with one embodiment, showing the assembly 102b on top of a support structure 106. In certain embodiments, the support structure 106 can be implemented using a cold plate to form all or part of the support structure 106, but this is not limiting. FIG. 3 is a top view 108 of the 2K array 100 of FIG. 1, in accordance with one embodiment, showing both the straight interface spacing 112 and lattice interface spacing 114 (discussed further herein).

Referring to FIGS. 1-3, as those of skill in the art will appreciate, in some embodiments that operate at high frequencies, each tile 102 can be very small (in one embodiment, the tile 102b is 3" by 3", for example, and the entire tile array 100 is just 6"×6", even though it has 2048 elements) and the spacing between tiles (as described further herein) is very small—in one embodiment it is about 10 mils. In addition, although not immediately apparent in FIGS. 1-5, in at least some embodiments, the tiles 102 are configured to be able to be disassembled to be serviced, as described further herein.

The tile 102 of the Figures herein (and other tiles described herein) can be made and/or adapted from known tile designs, including any of the designs mentioned in the various patents incorporated by reference herein. For example, commonly assigned U.S. Pat. No. 10,541,461, entitled, "Tile for an active electronically scanned array (AESA)." ("'461 patent"), which is hereby incorporated by reference, provides an illustrative example of a type of high frequency tile that can be adapted to be usable with at least some of the embodiments described herein. Additional examples can be found in the following commonly assigned U.S. patents, which are each incorporated by reference: U.S. Pat. No. 7,348,932 ("Tile Sub-Array and Related Techniques") and U.S. Pat. No. 9,172,145 ("Transmit/receive daughter card with integral circulator").

Although not visible in FIGS. 1-3, those of skill in the art will appreciate that the tile array 100 can include multiple electronics assemblies, modules, printed circuit boards (PCBs), and various interconnects, along with supports, heat sinks, cooling features, power inputs and outputs, and the like. Each tile assembly 102 is implemented to have its own respective ground plane (not visible in FIGS. 1-3, but when the tile assemblies 102 are joined together in an array, as in array 108, there can be issues with ensuring that all of the tile assemblies 102 have a common ground, as noted herein.

Figure 4B:
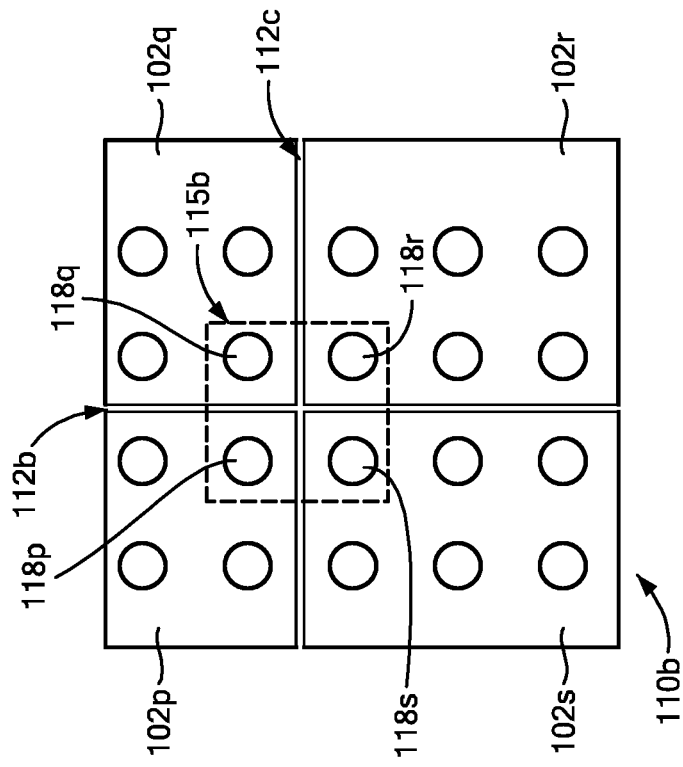
FIG. 4B is a second exemplary tile to tile interface, with a square element pattern, in accordance with on embodiment.
Figure 4A:
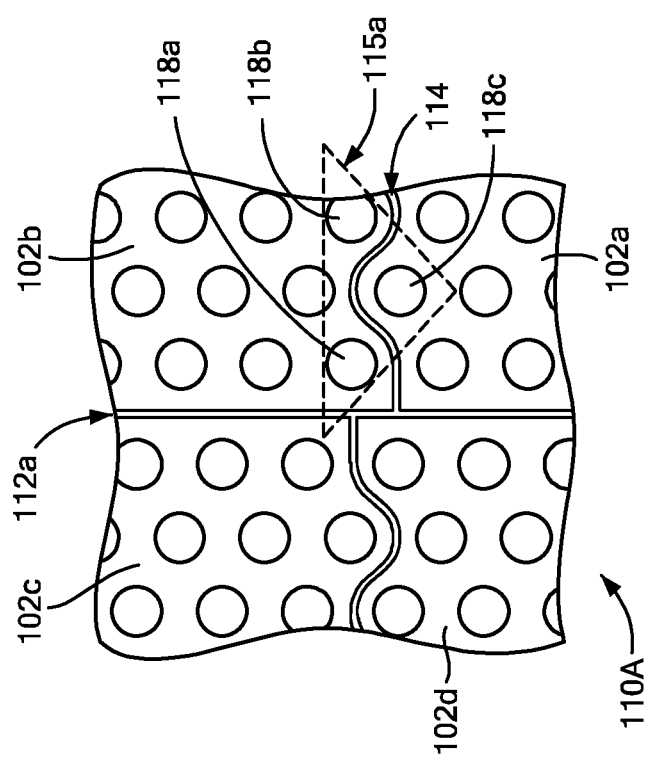
FIG. 4A is an enlarged view of the dashed region in FIG. 3, showing a first exemplary tile to tile interface, with a triangular element pattern, in accordance with one embodiment.

FIG. 4A is an enlarged view of the dashed region 110 in FIG. 3, showing an exemplary tile to tile interface between four tiles 102a-102d, in accordance with one embodiment. In FIG. 4A, the elements 102 are in a substantially triangular shaped pattern, as shown via the pattern outline 115a. The pattern of the elements 102 also could be viewed as diamond-shaped groupings, as will be appreciated. The straight portion of the interface in FIG. 4A is separated by a very small first spacing 112a which is, in at least some embodiments, approximately 0.011+/−0.010 inches (i.e., 1-21 mils) in size. Similarly, the lattice spacing 114 also is 0.011+/−0.010 inches (1-21 mils). In certain embodiments, the arrangement of FIGS. 1-5 (and other Figures described further herein) provides a design for array lattice continuity across CCA boundaries, to help bridging multiple RF tile Arrays 102 in a scalable RF tile array 100. The lattice continuity design provides a seamless ground plane, as described further herein, and this enables RF Tiles to be integrated into a seamless scalable RF Array using a common mechanical architecture, as described further herein. In certain embodiments, the RF element lattice spacing is maintained across multiple RF tiles 102a-102d, e.g., allowing for an effective aperture that will be the size of the combined RF tiles 102, as will be appreciated.

FIG. 4B is a second exemplary tile to tile interface 110b, with a square 115b (or, alternately, rectangular) element pattern, in accordance with on embodiment. FIG. 4B shows the interface between tiles 102p, 102q, 102r, 102s, where it can be seen that the square pattern 115b, in the illustrated interface 110b, is formed using element 118p from tile 102p, element 118q from tile 102q, element 118r from tile 102r, and element 118s from tile 102s. In certain embodiments, it can be critical to ensure that the straight spacing 112b, 112c between the four tiles 102p-102s, is maintained to ensure consistent spacing.

As FIGS. 4A-4B in at least some of the exemplary embodiments shown herein, the grounding between tiles is implemented via an array lattice continuity design, where the antenna pattern is maintained across the lattice edge. As will be appreciated, in these embodiments, the spacing between the lattice edges is critical, and needs to be maintained so that the lattice spacing is continuous, and the conductive grounding element configuration, as described herein, helps to ensure consistent and continuous lattice spacing by being able to bridge very small, but potentially variable, gaps between tiles. It also will be appreciated that the conductive grounding element arrangements described herein also are advantage and applicable to other types of gaps, even those associated with less critical component spacings.

Figure 5:
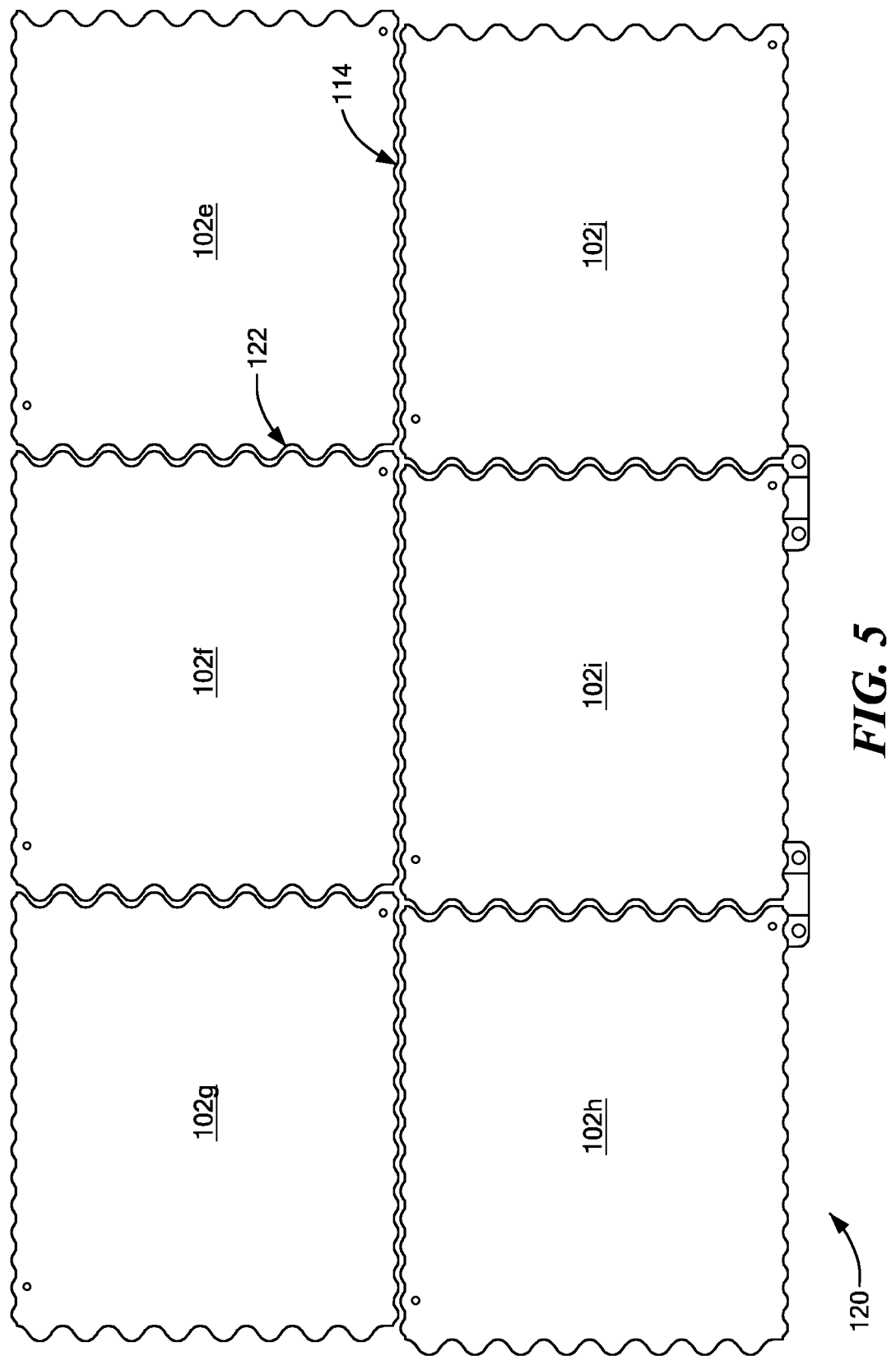
FIG. 5 is a top view of an exemplary array made using six of the tiles, where they are serrated on all sides, in accordance with one embodiment.

FIG. 5 is a top view 120 of an exemplary array made using six of the tiles 102e, 102f, 102g, 102h, 102i, 102j. In this embodiment, the tiles 102e-102j are serrated on all sides, in accordance with one embodiment. In one embodiment, the tiles 102 have straight sides in regions where the antenna element pattern is not impacted by a gap between adjacent tiles and does not extend between tiles, and serrated edges in regions where the element pattern needs to extend between tiles. With the serrated edges, it enables an antenna pattern that is spread between two adjacent tiles, to have the pattern extend without disturbing spacing, as will be apparent to one of skill in the art. In addition, in certain embodiments shown herein (e.g., FIGS. 4A, 4B, and FIG. 6) the straight edges also are lattice continuation. As those of skill in the art will appreciate, the type of edge can depend at least in part on the type of lattice design used (e.g., square patterns, triangular patterns etc.). For example, with a triangular lattice pattern 115a, as shown in FIG. 4A, the serrated edge between tiles 102b and 102a separates one portion 115a of the triangular lattice pattern, such that two elements (118a, 118b) are on one side of the lattice on one tile 102b, and one other element 118c is on the other side on tile 102a, so it is important that the overall spacing between elements 118 be consistent. Hence, there is a need to ensure that the serrated spacing 114 is consistent and does not vary. As described further herein, the conductive grounding element can help to compensate for variations in many aspects, including the spacing 114 itself, the sizes and shapes of tiles 102, variations in the assembly process, etc.

Figure 7:
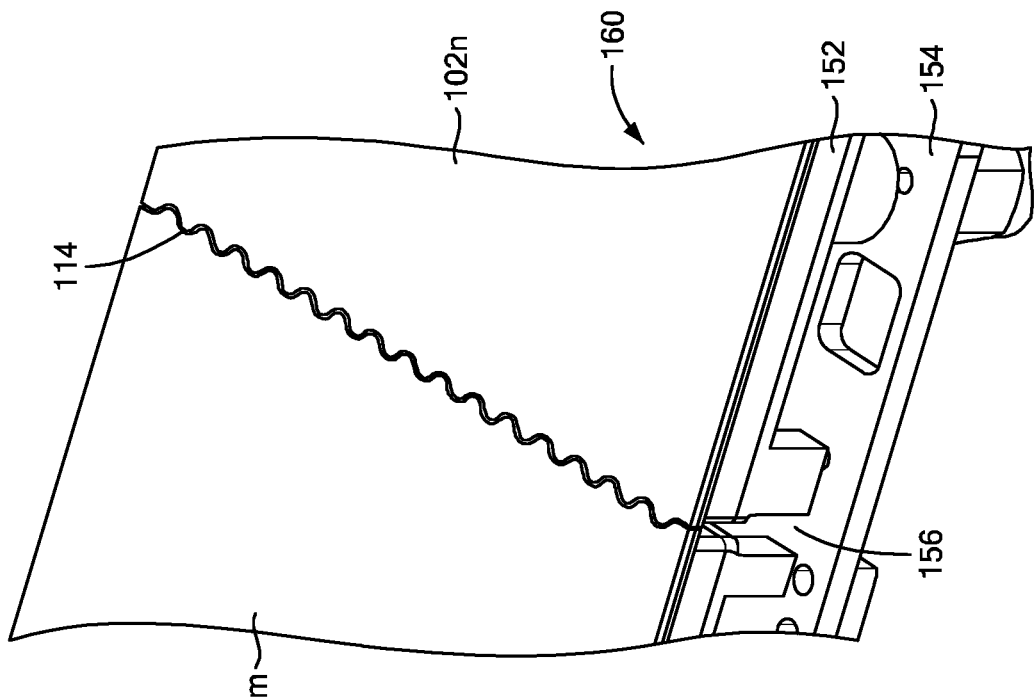
FIG. 7 is a perspective view of a serrated portion of a tile to tile interface, in accordance with one embodiment.
Figure 6:
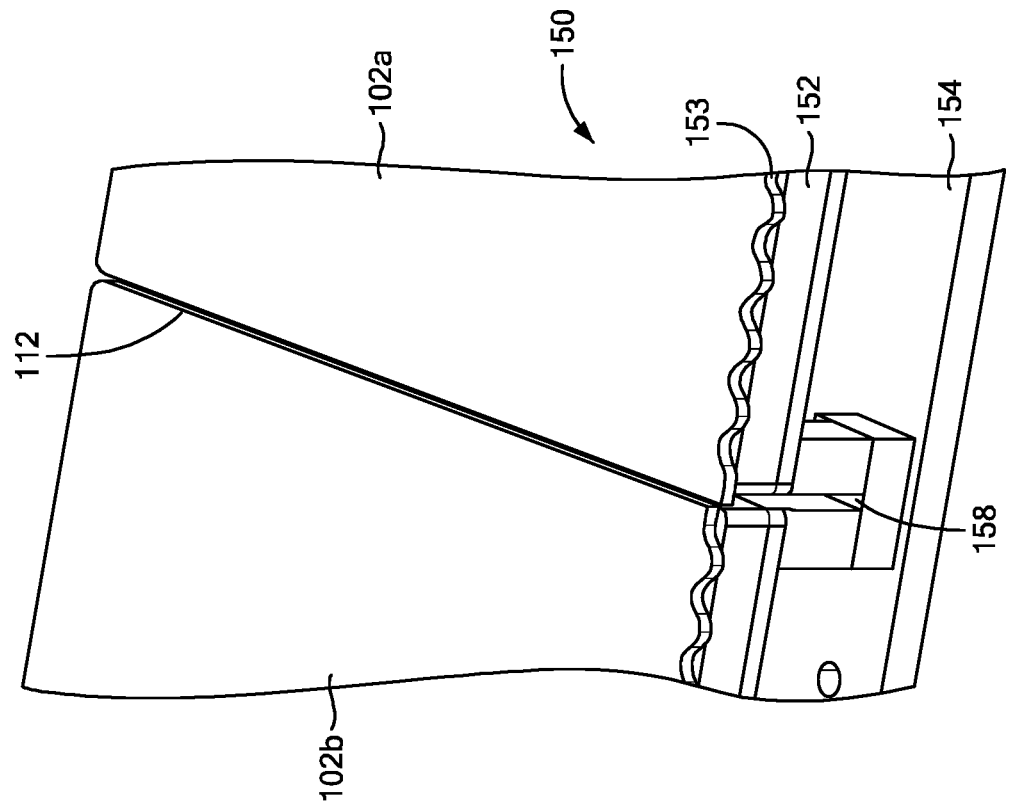
FIG. 6 is a perspective view of a straight portion of a tile to tile interface, in accordance with one embodiment.

FIG. 6 is a perspective view of such a straight tile to tile interface, between a first tile 102a and a second tile 102b, where the two tiles are separated by a gap spacing 112 which can be, in accordance with some embodiments, just 1-21 mils wide. FIG. 7 is a perspective view of a serrated tile to tile interface, in accordance with one embodiment. In both FIG. 6 and FIG. 7, a support structure 152 (which in some embodiments can be formed using a cold plate) is disposed near the board 153 containing radiator elements (which can include radiating and/or receiving elements). accordance with one embodiment.

The support structure 152 helps to hold the conductive grounding element used to provide the common ground plane to which each tile's ground plane is to be connected, as discussed further herein.

The example arrays of FIGS. 1-7 are shown and described to be substantially planar arrays having square tiles, but of course the embodiments described herein are not so limited, as noted previously. The tiles can be formed in virtually any usable shape, including but not limited to any polygon or curved shape. Moreover, the tiles themselves need not be substantially planar in all embodiments but can be adapted to be used with antenna arrays having a curved surface, such as having multi-dimensional curves and/or a conformal surface, as will be appreciated. In addition, the tiles in a given array or sub-array need not all have the exact same shape as each other, so long as they can be joined as described herein. Advantageously, in at least some embodiments, the antenna tiles are configured to have sides that mate with adjacent tiles, such as by having sides that have mating serrated or serpentine patterns, as shown herein in FIGS. 3-7, to best incorporate the RF ground material, as described further herein.

As those of skill in the art will appreciate, providing certain types of edge shapes on the antenna tile, such as serrated or serpentine types of edges, can help provide several additional advantages, both mechanical and electrical. Mechanically, the serpentine/serrated edge can improve the "interlocking" between tiles, to better support structural integrity of the array, especially during environmental conditions that can involve vibration. As noted above, electrically, coupling the tiles together using a serpentine or serrated kind of edge (or any edge pattern which does not break up a given pattern of antenna elements) also can provide electrical advantages, such as helping to enable substantial continuity in the particular pattern shape of antenna elements thereon.

As is understood in the art, a pattern shape of antenna elements on a tile (e.g., the triangle pattern shown in FIG. 4A or the square pattern in FIG. 4B) can be associated with a particular lattice structure of elements on the tile. For example, looking in FIG. 4A along the lattice border 114 between antenna tiles 102a and 102b, it can be seen that the set of elements contained in triangular-shaped dotted region 115a, include two elements on tile 102b and one element on tile 102a, which in some instances can cooperate together to form a larger antenna aperture. Similarly, in FIG. 4B, along the straight borders 112a and 112b, it can be seen that the set of elements contained in square shaped dotted region 115b include an element from each of four different tiles 102e, 102f, 102g, and 102h. Furthermore, the antenna tiles need not all have the same number of radiating elements, even if the antenna tiles have the same shape.

Figure 8:
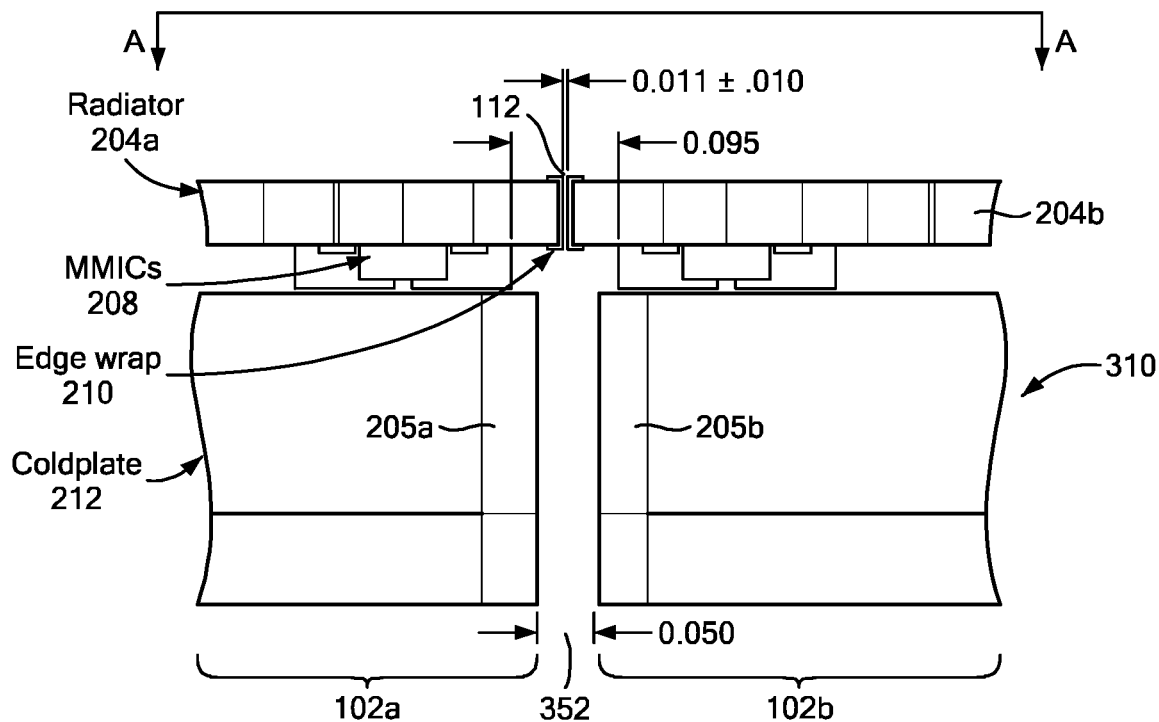
FIG. 8 is a first exemplary cross-sectional side view of an interface between two tiles, in accordance with one embodiment.

FIG. 8 is a first exemplary cross-sectional side view 310 of an interface and gap 112 between two tiles, such as the tiles 102a, 102b of FIGS. 1-7, in accordance with one embodiment, where this view shows the interface before any application of grounding elements or gaskets (as discussed further herein). The interface of FIG. 8 can correspond to a portion of the cross section of the interface similar to that shown in FIG. 4A, which itself also is analogous to the interface of FIG. 9 (described further below). The interface shows a first tile 102a that is to be coupled to a second tile 102b. Note that FIG. 8 shows just a small portion of each tile 102a, 102b, and does not show all tile components and features. Any of the embodiments of described herein can be implemented or adapted to be implemented in the interface depicted in FIG. 8, as will be appreciated.

As shown in the view of FIG. 8, each tile 102a, 102b, includes a respective radiator 204a, 204b, where each radiator 204a, 204b has, along its respective border/edge with the other tile 102, a corresponding edge wrap portion 210 (also known as edge plating portion 210), which advantageously is made from a conductive material in at least some embodiments. In at least some embodiments, the radiator 204 has a built in portion of its external surface with a connection to ground, such as the aforementioned edge wrap or a ground connection on a bottom side, or both. This portion that connects to the ground of the radiator 204, is what the conductive grounding element is configured to mechanically and electrically couple to, as will be described further herein. The radiator 204 of each tile 102 also is coupled to one or more respective monolithic microwave integrated circuits (MMICs) 208, which are configured to cooperate with antenna elements 118 (e.g., as shown in FIGS. 4A-4B). For example, the MMIC circuits 208 can be transmit/receive (T/R) circuits. In addition, although not depicted in FIG. 8, those of skill in the art will appreciated that each antenna tile 102 also can include connections to other electrical components not shown (but further described above and in the various incorporated by reference patents mentioned herein).

For each tile 102a, 102b, a respective support structure 212 is operably coupled to the MMICs 208. Advantageously, in at least some embodiments, the support structure 212 can correspond to a cold plate 212 for the tile, but this is not limiting—many different support structures are usable. In certain embodiments, as described further herein, an RF grounding element for the tile to tile connection, can be operably coupled to, or disposed adjacent to, an outer edge 205 of the support structure 212 (as discussed further herein). As FIG. 8 illustrates, there is a support structure 212 spacing 352 between the outer edges 205a, 206 for the respective support structures 212 for each radiator 204a, 204b. The interface of the embodiment of FIG. 8 is for tiles operating in the mm-wave frequency range; hence, the spacing between a first radiator 204a of a first tile, and a second radiator 204b of a second tile, is very small (just 11 mils+/1 10 mils), and the support structure 212 spacing 352 also is small (about 50 mils). The spacing shown as 95 mils in FIG. 8 corresponds to a spacing covered by a conductive gasket or other grounding element (e.g., as shown and described further in FIGS. 10-12B, and 17-25).

Figure 9:
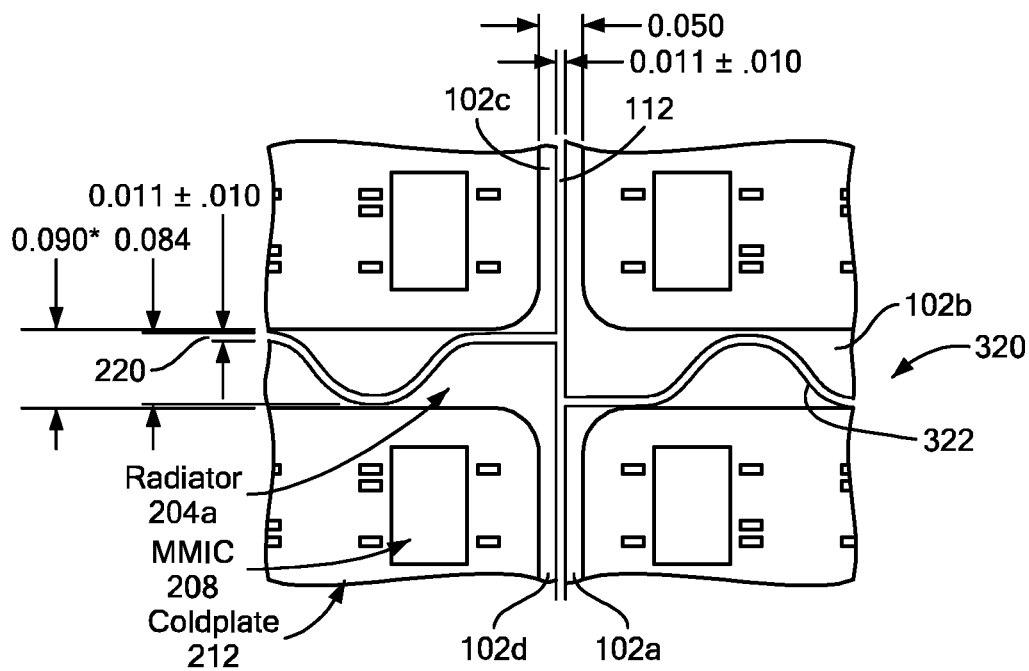
FIG. 9 is an exemplary top view of the interface of FIG. 8, taken along the A-A line, in accordance with one embodiment.

FIG. 9 is an exemplary top view 320 of the interface of FIGS. 4 and 8, taken along the A-A line, in accordance with one embodiment. FIG. 9 shows that, in certain embodiments, along the serpentine edge 322 of the junction between two or more tiles 102, the distance between support structures 12 is approximately 90 mils and the maximum distance between the support structure and the serpentine gap 322, is approximately 84 mils, and a width of the serpentine gap 322 itself is 11+/-10 mils.

An issue that arises at very high frequencies is that even the small straight edge gap between support structure, of 50-90 mils, 112 (1-21 mils) and serpentine gap 322 (1-21 mils) can be significant in its negative effect on antenna pattern performance, if not bridged or addressed. However, it can be difficult to attempt to bridge the 50-90 mil support structure 212 gap (e.g., in certain embodiments, cold plate 212) when the gap between the radiators 204 that are nearby, is so small (1-21 mils). It can be very difficult to provide any element that can bridge the 50-80 mil gap to provide RF grounding between the first radiator 204a and second radiator 204b, while still fitting between the 1-21 mil gap. With such small gaps, it also can be difficult to compensate for manufacturing and assembly tolerance variations. In addition, because of the need to maintain the very small lattice spacing between antenna elements at very high frequencies (for proper operation and generation of antenna patterns, etc.), the way that tiles are joined, RF and/or other grounds are provided, and/or gaps are bridged, any solutions that provide grounding, connections, bridging, etc., must be sized so as not to interfere with lattice spacing (i.e., not be too small, not be too big, so as to change the lattice spacing). Further, in environments with severe conditions of temperature, temperature variations, vibration, etc., any techniques for grounding antenna tiles and/or and joining antenna tiles must be resistant to damage and issues caused by environmental conditions.

For example, it can be advantageous if the technique (e.g., material) for joining the tiles effectively has compressibility that can be operable to dynamically adjust and compensate for variations in the gap shape, not just arising during manufacture and/or assembly, but also possibly arising from environmental conditions that arise during use, such as thermal expansion and contraction of other components, possible shifts due to vibration, shock, etc., which potentially can affect the size of the gap and, hence, the lattice spacing. Those of skill in the art will appreciate that if any conductive RF or other grounding connection comes loose during operation, it can short out circuits and cause damage. In addition, it is advantageous if techniques for grounding antenna tiles and/or joining antenna tiles, provide the ability to perform repairs, replacements, and/or upgrades once an array is manufactured and fielded. This can be very difficult with some methods of providing RF ground and/or attachment of tiles (e.g., with adhesives, solder, etc.).

In at least some embodiments herein, configurations are provided to help provide a reliable RF ground, across physically separated components (such as RF subarrays, tile sub arrays, etc.) while maintaining lattice spacing continuity across the physical boundaries, even at very high frequencies. In certain embodiments, this is done by providing a conductive grounding element that can be coupled so as to provide an RF ground between the physically separated components, where the conductive grounding element, in certain embodiments, is resilient and/or compressible, so as to be configured to fit even within the small gaps and lattice spacing required for high frequency arrays and to be able to contact ground planes of modules to help connect them to a common ground plane for the array, as described below. In certain embodiments, the conductive grounding element makes contact with and/or is coupled to a support structure, which can be formed using a cold plate (though this is not limiting). In certain embodiments, the conductive grounding element is configured to make contact, as part of the assembly process, with a conductive ground portion of each of two physically separate modules so as to conductively connect the respective grounds on those modules to a common ground point, which itself is in operable conductive communication with the conductive grounding element. The support structure can be implemented using any components or structures or layers that are capable of supporting the tiles and which are capable of having the conductive grounding element closely coupled thereto. In certain embodiments, the support structure can be formed using a respective cold plate for each module. The support structure, in certain embodiments, is configured to help ensure that the conductive grounding element makes the contact needed to ensure that a continuous RF ground is formed between the tiles or other subsystems.

There are various ways for the conductive grounding element to make contact with the ground planes of the tiles (or other systems) that are being coupled to a common RF ground. In certain embodiments, the conductive grounding element makes electrical contact with either or both of the bottom sides of each of two physically separated components to be joined, where the bottom sides have at least a portion or region that is in electrical communication with the grounds of the circuits (though in some embodiments, the bottom can be a metallized surface, as will be appreciated). In certain embodiments, the conductive grounding element makes electrical contact with either or both of the conductive edges of the modules to be joined. In certain embodiments, as described herein, the conductive grounding element is electrically contacting a specific layer of a circuit card assembly (CCA), where that specific layer is electrically connected to the ground plane of the CCA. For example, in some embodiments, the conductive grounding element is in contact with the bottom layer of the CCA, where the bottom layer is electrically connected to a ground plane of the CCA (e.g., a MMIC ground plane) through one or more conductive vias. In certain embodiments, the conductive grounding element is configured to make physical contact between edges of a board of a CCA such that the conductive grounding element makes electrical contact with the ground plane where it exits the edge of the board. In certain embodiments, the support structure (e.g., coldplate) is not part of any ground path and serves as a mounting feature for the conductive grounding element, wherein the ground path flows through the contact between the bottom layer of a first tile (which bottom layer is in electrical communication with the ground plane of the first tile/subsystem), through a portion of the conductive grounding element in contact with the bottom layer, to the portion of the conductive grounding element that is in contact with the bottom layer of a second tile (which bottom layer is in electrical communication with the ground plane of the second tile/subsystem). One of skill in the art will appreciate that additional arrangements are possible, so long as the conductive grounding element is able to both couple together the RF grounds of the two adjacent tiles/subsystems and also is able to bridge any gaps between the adjacent tiles/subsystems so as to help ensure that the RF ground path is connected.

In certain embodiments, the conductive grounding element is a sheet of compressible conductive material, such as a conductive gasket, a portion of conductive polymer material, etc. In certain embodiments, the conductive grounding element can have compressible portions and non-compressible portions, as well. In certain embodiments, the conductive grounding element changes its shape during compression, to be able to contact and provide grounding to more points on the two modules to be grounded. In certain embodiments, the compressibility of the conductive grounding element advantageously helps ensure that there is continuous RF grounding between tiles (or other subsystems) even during changes in environmental conditions during operation, such as temperature extremes, vibration, mechanical shock, etc. This is explained further herein. In certain embodiments, the conductive grounding element does not have to actually be permanently/fixedly attached to any part of the assembly but can be formed using a resilient material so that it can be added during assembly and held in place via several different methods, individually or in combination. In certain embodiments, the conductive grounding element is held into place between adjacent tiles (or other components) via friction resulting from compressive forces. In certain embodiments, the conductive grounding element is held into place via mechanical features formed, e.g., into the support structure or other components, such as grooves, openings, apertures, and/or other arrangements matched to mate to the shape of the conductive grounding element and configured to hold the conductive grounding element in place (e.g., without adhesive), e.g., as shown with the T-shaped formed conductive gasket 432 of FIG. 15, discussed further herein. In certain embodiments, the conductive grounding element is held into place via an adhesive (which need not be electrically conductive adhesive, but which can be conductive, if desired). In certain embodiments, the conductive grounding element is used to couple together ground planes on each respective tile (or other subsystem), to form a new common ground plane that is common to all the tiles in the array.

The compressibility of the conductive grounding element is an important factor in helping to provide the continuous RF ground between adjacent tiles. Having compressibility (e.g., as found in a component such as a gasket) compensates for part and assembly variations within the manufacturing tolerances of the entities (e.g., tiles) being joined together. For example, if the tile edge has a bit of a wave, or is not perfectly parallel, or if the gap is wider or smaller, as assembled, the compressible conductive grounding element helps to compensate for that deficiency. In contrast, using a non-compressible or rigid material, such as a metal shim, would not result in the same degree of compensation. A rigid grounding element cannot fully bridge a gap that might vary, either due to an edge that is not straight, or an assembly process or design that might allow the gap dimension to vary from one tile to the next.

Figure 10:
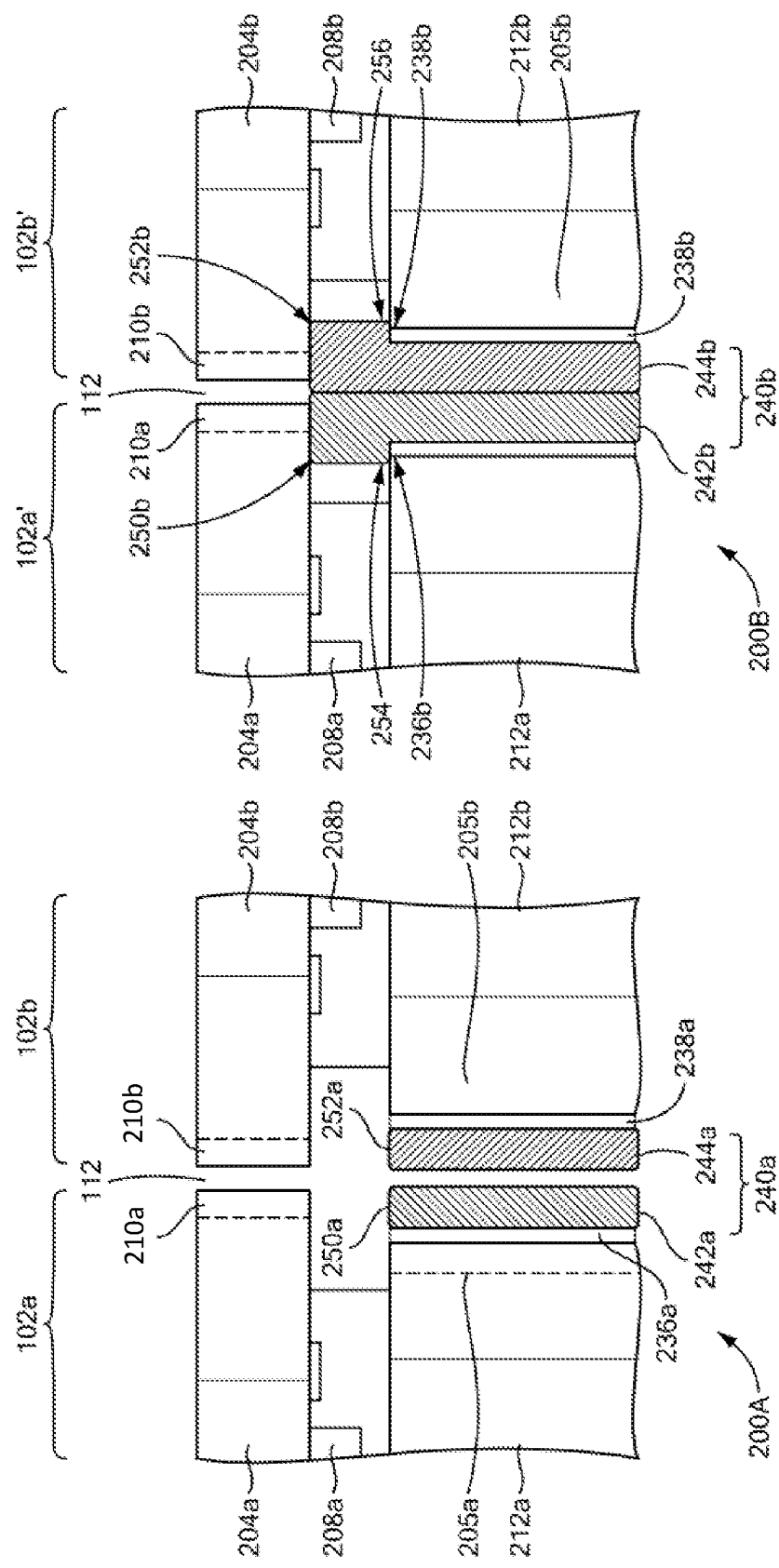
FIG. 10 shows exemplary first (FIG. 10A) and second (FIG. 10B) cross-sectional side views of exemplary first and second interfaces between two tiles, showing the tiles as assembled to a support structure before compression (FIG. 10A) and after compression (FIG. 10B), respectively, in accordance with one embodiment.

FIG. 10 includes FIGS. 10A-10B, which are exemplary first 200A and second 200B cross-sectional side views of one embodiment that can address some of the issues discussed herein and which help to illustrate how the compressible grounding element addressed the issues. FIGS. 10A-10B show an interface between two tiles 102a, 102b, showing the tiles 102a, 102b as assembled to respective support structures 212a, 212b (which in this example embodiment are cold plates, but that is not limiting). FIG. 10A shows a side view 200A before compression and assembly together, and FIG. 10B shows a side view 200B after compression and assembly together.

Referring first to FIG. 10A, a conductive grounding element 240a is provided in the form of two sub portions: a first conductive material portion 242a and a second conductive material portion 244a. Note that the conductive grounding element 240a also, in certain embodiments, is formed using a solid, continuous structure versus two separate portions, though the solid continuous structure itself may be formed of multiple materials sandwiched together, mixed together or otherwise combined; such a solid continuous structure need not entirely be made of one type of material. Advantageously, however, by having a first conductive material portion 242a and a second conductive material portion 244b, it can be possible to assemble each to a respective support structure 212a, which can simply assembly.

Referring to FIG. 10A, in this embodiment, the first conductive material portion 242a is attached to first support structure 212a via first adhesive 236a, along the outer edge 205a of the first support structure 212a. As noted elsewhere herein, use of adhesive is not required for all elements, because in at least some embodiments, compression of the conductive grounding element helps to ensure good electrical contact. The first adhesive need not run the entire length of the outer edge 205a of the first support structure 212a but can be provided in any manner and quantity sufficient to enable the first conductive material portion 242a to be held in place to the outer edge 205a of the support structure 212a. In some embodiments, no first adhesive 236a is necessary at all, if the first conductive material portion 242a is formed using a material that is sufficiently "tacky" or "sticky" to adhere to the outer edge 205a of the first support structure 212a, on its own, even if the adherence is light and temporary, so long as it adheres long enough for the first and second tiles 102a, 102b to be joined together in the array in a manner that will hold the conductive grounding element 240a in place.

In some embodiments, the assembly process is arranged so that the assembly of FIG. 10A is done rapidly and precisely enough to ensure that the conductive material portions 242a, 244b (or even a conductive grounding element 240a formed using a single, integral portion of conductive material, instead of the first portion 242a and second portion 244a) are assembled in and held into place without need for adhesive or any adhesive-like features (e.g., stickiness). For example, in certain embodiments, depending on the assembly process, the first conductive material portion 242a and the second conductive material portion 244a, can simply be provided at assembly time, with no adhesives, and joined together to the assembly via compression or pressure to hold the respective first and second conductive material portions in place.

The second conductive material portion 244b can be similarly attached to the outer edge 205b of the support structure 212b of tile 102b as was done with first conductive material portion 242a, such as via second adhesive 238a, or simply via inherent stickiness/tackiness (as noted previously), or not joined together until the first and second tiles 102a, 102b, are joined together. In a further embodiment, the second conductive material portion 244a could instead be adhered to the first conductive material portion, so that it can later make conductive contact with the second support structure 212b, when the first and second tiles 102a, 102b, are joined together.

The first and second conductive material portions 242a, 244b, can be made of the same material or different materials. They can be formed wherein the first conductive material portion 242a has a compressibility that is the same, greater than, or less than, a compressibility of the second conductive material portion. The particular materials that can be used for either or both the first and second conductive material portions, are described further below. In another embodiment, the first and second conductive material portions can also be integrally formed together into a single conductive grounding element that can be coupled to one tile or the other, or to neither (and simply held in place at assembly time). Although not illustrated in FIG. 10A or FIG. 10b, one of skill in the art will appreciate that the conductive grounding element 240 also could be formed using more than two portions of conductive material.

As the embodiment of FIG. 10A shows, before first and second tiles 102a, 102b have their support structures 212a, 212b, slightly compressed together, the two parts of conductive grounding element 240a (the first conductive material portion 242a and the second conductive material portion 244a), are not yet in conductive, electrical, and/or or mechanical contact with each other and are not yet in physical or electrical contact with any element that is in electrical communication with the RF ground of the radiators 204a, 204b. In another embodiment (not specifically depicted in FIG. 10A, but readily understood), before first and second tiles 102a, 102b have their support structures 212a, 212b, slightly compressed together, the two parts of conductive grounding element 240a (the first conductive material portion 242a and the second conductive material portion 244a) might be in conductive, electrical, and/or mechanical contact with each other, but are not yet in physical or electrical contact with any element that is in electrical communication with the RF ground of the radiators 204a, 204b. In the embodiment shown in FIG. 10A, the top surface 250a of first conductive material portion 242a and the top surface 242a of second conductive material portion 244a, are not yet in contact with RF ground of the radiators 204a, 204b. Thus, in certain embodiments, when the assembly 240a is in the position of FIG. 10A, the tiles 102a, 102b, are not yet commonly grounded together via the conductive grounding element 240a.

If the assembly of FIG. 10A had no conductive grounding element 240a at all, any common grounding between the tiles 102a, 102b would be relying on direct or very close contact between a ground plane connection of the first radiator 204a and a ground plane connection of the second radiator 204b, along the seam 112, which effectively is a small gap 112. However, there can be issues which can prevent a close enough connection between the tiles 202a, 202b, to ensure that they are connected to a common ground (e.g., the ground of each tile 202a, 202b is coupled to the same RF ground), especially at high frequencies. As noted in FIG. 8, the width of the seam/gap 112 can range from 1 mil to 21 mil, along the length of the seam, but due to inherent manufacturing tolerances in the making of the radiators 204a, 204b, the size of this gap can become even bigger. In certain embodiments, the nominal gap width 112 is driven by board fabrication tolerances and also by the need to ensure that the tiles/subsystems/boards do not interfere with each other when assembled. Other designs are possible, including other ranges of sizes of gap (e.g., 5-25 mils), and the widths of gaps discussed herein are intended to be exemplary and not limiting. As will be appreciated, the point at which the size of the gap becomes concerning, can be at least partially dependent on the operational frequency range of the circuits. As noted above, the "length" of a ground run varies based on frequency, with the rule that an electrical ground connection is considered "long" (with all the complications, losses and issues that entails) if the length of the path to ground is greater than $1/20^{th}$ the wavelength of the frequency used. For a very high frequency, e.g., 50 GHz (wavelength of $5.9958 \times 10^{-3}$ m, or 236 mils), the $1/20^{th}$ wavelength rule works out to path lengths of greater than 11.8 mils (0.00118 inches)—essentially approaching the same size as the width of the gap itself (11 mils+/−10 mils, per FIG. 8).

Thus, at very high frequencies, and with the manufacturing tolerances that can arise, to ensure that there is RF grounding across tile subarrays, physical connections have to be used (e.g., vie metal springs, shims, conductive epoxy, solder, various permanent attachments, as discussed previously), it is important to ensure that there is RF grounding across tiled subarrays. However, these methods of connection can end up adding electrical "length" to the ground connection (because they can be thicker than the gap size of 11+/−10 mils), and the added physical length can potentially increase the width of the gap 112, which can negatively impact lattice spacing, and thus negatively impact the antenna patterns.

The embodiment of FIGS. 10A-10B, however, helps to avoid the above problems. As shown in FIG. 10B, the support structures 212a, 212b are able to be slid towards each other slightly, when the tiles 102a, 102b are assembled together, and the movement towards each other of support structures 212a, 212b (which movement is not able to be shown in FIGS. 10A and 10B) helps to cause a slight compression and deformation of the conductive grounding element 240b, as shown in FIG. 10B. This slight compression causes the top surface 250s of the first conductive grounding material 242b and the top surface 252b of the second conductive grounding material 244b, to be pushed upward (effectively compressing and stretching the entire conductive grounding element 240b), such that the two top surfaces 250b, 252b are able to make contact with the metalized surface of boards that are at the bottoms of radiator 204a and 204b, respectively, as shown in FIG. 10B. This contact, which is both physical and electrical, establishes and ensures the RF grounding path between radiator 204a and radiator 204b. In some embodiments, the top surfaces 250a, 252 make contact with other parts of boards that are part of radiators 204a, 204b, where these other parts are in operable electrical communication with the RF ground of the respective radiator 204a, 204b.

In particular, in the example embodiment of FIGS. 10A-10B, the top surface 250b of the first conductive grounding material 242b makes both mechanical and electrical contact, at least with conductive edge wrap 210a of the first radiator 204a. Note that conductive edge wrap is not needed for all embodiments; as explained previously, the conductive grounding element simply needs to make electrical contact with some part of tile 102 that is in electrical communication with the circuit ground plane of the tile 102. This electrical contact can be accomplished by the conductive grounding element making physical contact with a part of the tile 102 that is in electrical communication with the ground plane— in the example of FIGS. 10A-10B, it is the conductive edge wrap, but in other embodiments it could be a bottom layer of the radiator 204, a portion of ground plane projecting along the edge of the radiator 204, one or more conductive or metallized vias that runs through radiator 204 (e.g., within the radiator, to tie together any grounds within the layers of any boards in the circuit, or running within the radiator to the edge of the board, etc.) and couples to the ground plane and to whatever part of radiator 204 is in contact with the via, etc.

Similarly, the top surface 252b of the second conductive grounding material 244b makes both mechanical and electrical contact, at least with conductive edge wrap 210b of the second radiator 204b. Because the conductive edge wraps 210a, 210b are in operable communication with the ground planes of each respective tile 102a, 102b, a short electrical RF ground path is created from each of the respective tiles 102a, 102b, to ensure a reliable and electrically "short" (at mm-wave frequencies) RF ground across the boundaries of the tiles 202a, 202b. In addition, the slight compression of the conductive grounding element 240b, helps to fill any physical gaps between the first and second tiles 102a, 102b, to help strengthen the physical and mechanical connection between the tiles 102a, 102b.

Advantageously, because the conductive grounding element 240b is either held in place without adhesive (i.e., only by compression/friction or by inherent "tackiness" of the material(s) from which it is made) or by minimal amounts of adhesive, and because the tiles 102a, 102b are coupled together primarily along the seam suing via the conductive grounding element 240b, it can be simpler to remove and repair or replace a single tile in an array, using the arrangement of FIGS. 10A-10B, than with other implementations.

Thus, in at least one embodiment, the arrangement of FIGS. 10A-10B provides one embodiment of a novel design for creating a continuous RF ground across the physical boundaries of multiple RF sub-arrays, such as the tiles 102a, 102b. As will be appreciated, this novel design enables the design and build of large, scalable and configurable RF Arrays. The design of FIGS. 10A-10B effectively joins the radiating CCAs along the edges of the CCAs, but as noted above, this is not limiting.

Figure 11:
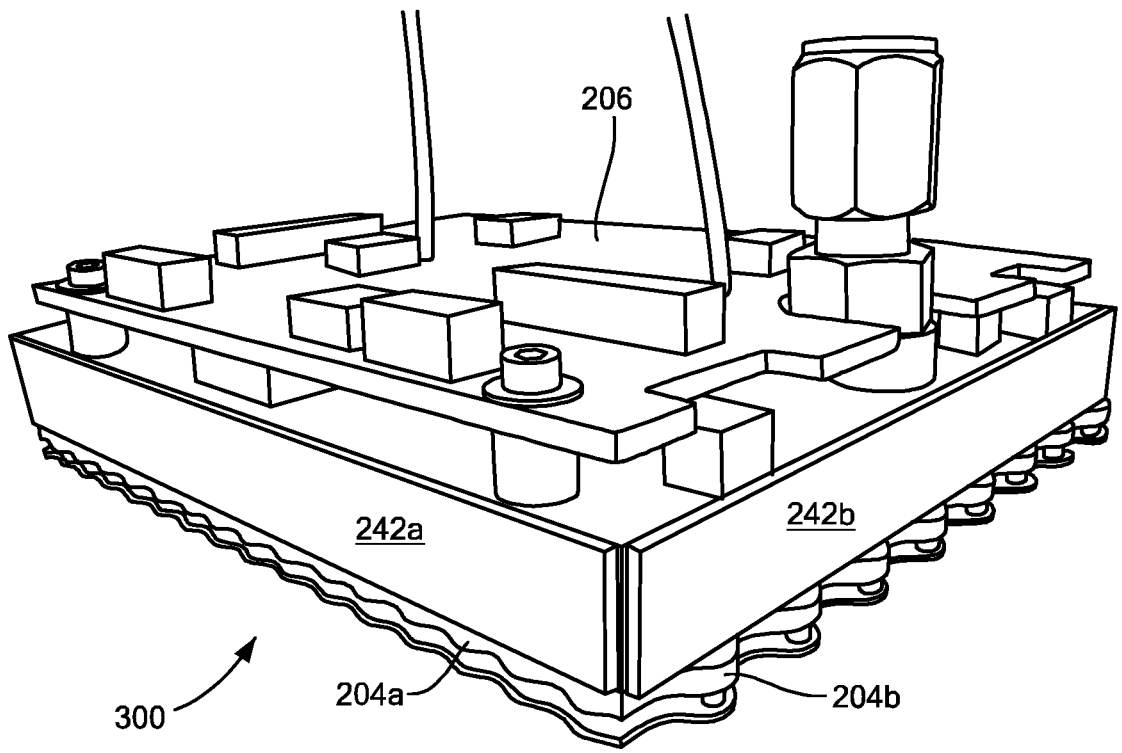
FIG. 11 is a perspective view of an exemplary single 256-element tile assembly, showing the implementation of FIG. 10A as applied to a tile assembly, in accordance with one embodiment.
Figure 12:
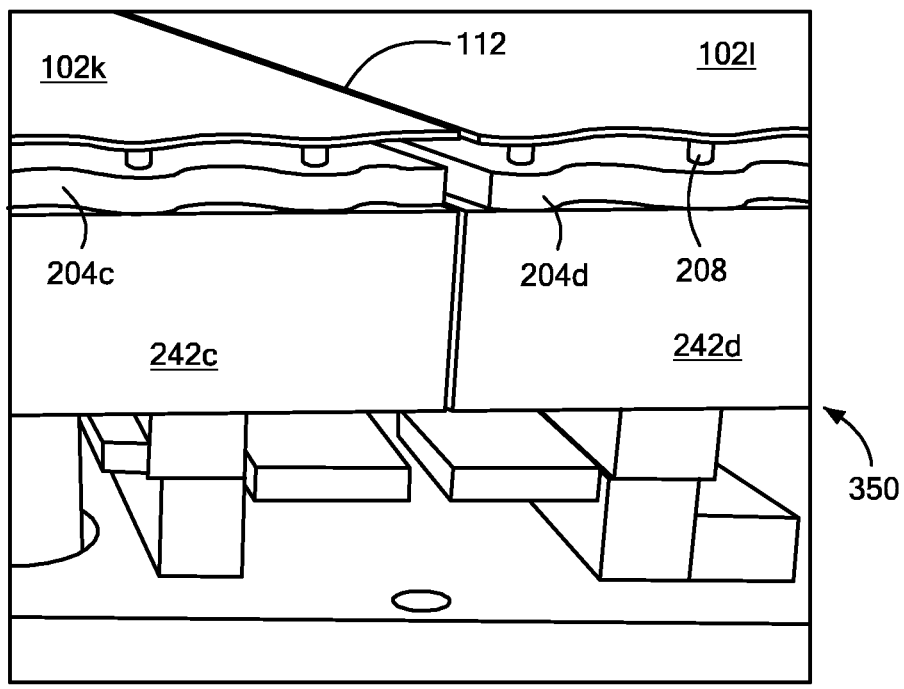
FIG. 12 is an exemplary detailed view showing RF gasket grounding at the edge of two RF sub-arrays, in accordance with one embodiment.

FIG. 11 is a perspective view of an exemplary single 256-element tile assembly 300, showing the implementation of FIG. 10A as applied to a tile assembly 300, in accordance with one embodiment. FIG. 12 is an exemplary detailed view 350 showing two assemblies 300 of FIG. 11 as connected together to form a subarray. Referring to FIG. 11, this view shows an assembly similar to the edge view of FIG. 10A, but turned upside down, with the radiator 204 on the bottom and showing a circuit assembly 206 (e.g., DC power, intermediate frequency (IF) connections, DC control, one or more RF or IF connections, etc.) to which the tile is mounted. The assembly 300 has a conductive grounding element material 242a, 242b coupled to each of two visible sides, respectively (the support structure 212, e.g., a cold plate, is not visible in this view). The detailed view of FIG. 12 shows the conductive grounding element material 242c, 242d, on two antenna tiles 102k, 102l, coupled together along the seam/gap 112.

In some embodiments, the conductive grounding element 240 (including the conductive grounding element material portions 242, 244) can be constructed from a conductive polymer material (e.g., as is used with RF gaskets), and can be applied to any structure on the tile array, including but not limited to various types of support structures (such as cold plates). The conductive material used for the conductive grounding element 240 may be commercially available or application specific. In certain embodiments, the conductive material is selected and tested so that it can creates continuity at millimeter wave RF, by compressing between adjacent radiating CCAs and adjacent support structures, as shown in FIG. 10B. The conductive grounding element 240, in certain embodiments, compresses to fill gaps and to ensure continuous conductive contact between modules to be connected, such as the first and second tiles 102a, 102b. The arrangement of the conductive grounding element 240, as shown in FIGS. 10A-10B, helps to provide compliance to manage mechanical assembly tolerances. In addition, the arrangement of FIGS. 10A-10B is serviceable and does not require removal of adjacent tiles during repair.

Various materials are usable for the conductive grounding element 240 and/or each of the respective first and second grounding materials 242, 244. Advantageously, the material used for a first and/or second grounding material 242, 244, or a conductive grounding element 240, is made using a conductive, compressible polymer material, such a type used to make an RF gasket. For example, usable materials include, but are not limited to materials in the table of FIG. 13, which is an overview table of exemplary usable materials for the conductive grounding element, in accordance with at least some embodiments. Those of skill in the art will appreciate that the listed materials in FIG. 13 are merely exemplary and not limiting.

Various types of optional adhesives can be used to adhere one or both sides of the conductive grounding element 240 (i.e., each of the first and second grounding materials 242, 244), via the adhesives 236, 238 shown in FIGS. 10A-10B. For example, in certain embodiments, usable adhesives can include adhesives such as epoxy, Loctite PST, and/or pressure sensitive adhesive (PSA). The adhesive need not itself be conductive and can be applied to either the support structure or the grounding element/materials, before assembly. In addition, adhesive is not required in all embodiments, as will be appreciated, because the conductive grounding element 240 can be held in place, in at least some embodiments, by just the friction generated by compression, or by one or more mechanical features, such as grooves, mechanical fasteners, etc.

Although FIGS. 10A-10B demonstrate ways to achieve a common ground plane across tiles in accordance with at least some embodiments, there are additional configurations that are also contemplated as being able to solve at least some of the problems described herein, and FIGS. 14-28, briefly outlined below, show and briefly describe additional embodiments. Generally, in the embodiments of FIGS. 14-28, the positions of the support structure 212, radiator 204, gap 112, etc., are all substantially identical to those shown in FIGS. 10A-10B (although these positions are not limiting), but it is the conductive grounding element, or system of conductive grounding, which is varied in the different embodiments. For simplicity the before and after compression, if applicable, is not shown for each embodiment, but those of skill in the art will readily understand, especially given the material, how it will compress to ensure mechanical and conductive contact.

Figures 14, 15:
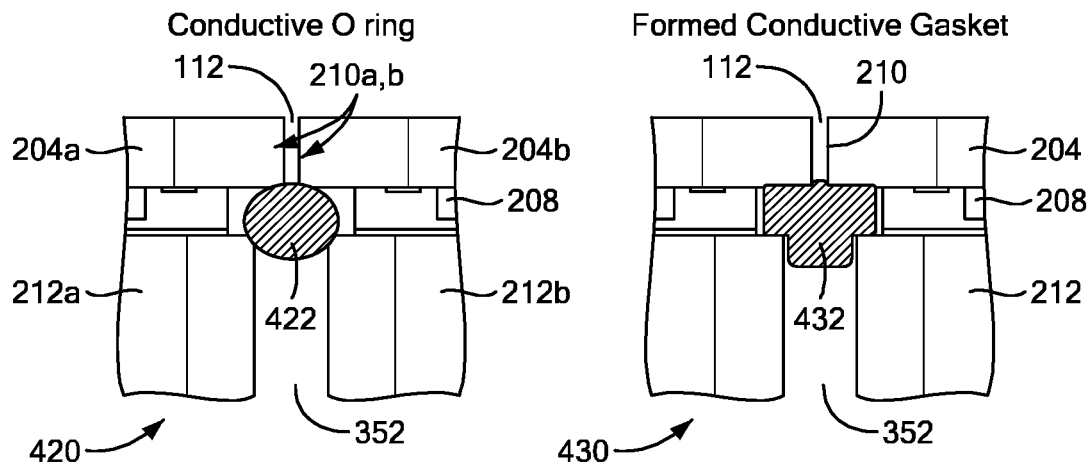
FIG. 14 is an exemplary cross sectional view of a grounding arrangement that uses a conductive O-ring, in accordance with one embodiment.
FIG. 15 is an exemplary cross sectional view of a grounding arrangement that uses a formed conductive gasket, in accordance with one embodiment.

FIG. 14 is an exemplary cross sectional view 420 of a grounding arrangement that uses a conductive O-ring 422, in accordance with one embodiment. In this arrangement, the O-ring 422 can be stretched or tacked into place prior to or while the tiles are being assembled together. As FIG. 14 shows, the O-ring 422 does make mechanical and electrical contact between the conductive edges 210a, 210b as well as the support structures 212a, 212b. One limitation with this approach can be difficulties in ensuring that the conductive O-ring 222 fully covers the tile edges 202 if the edges are serpentine edges.

FIG. 15 is an exemplary cross sectional view of a grounding arrangement 430 that uses a formed conductive gasket 432, in accordance with one embodiment. As illustrated in FIG. 15, the formed conductive gasket 432 has a "T" shape, with one sections of the "T" that mates into the support structure 212 spacing 352 as well as two other sections of the T that mate into openings near the MMICs 208, and the T shape of the formed conductive gasket 432 also is shown to be in contact with the conductive edge wrap 210 of the radiators 204. The formed conductive gasket 432 can have similar properties to the conductive grounding element 440 of FIG. 10 and can be formed using similar materials to those shown in FIG. 13. When the formed conductive gasket 432 is installed between two tiles, in certain embodiments, it can be compressed into one of the two tiles prior to assembly. Care must be taken, however, to ensure that the formed conductive gasket has sufficient volume to stay in place during assembly.

Figures 16, 17:
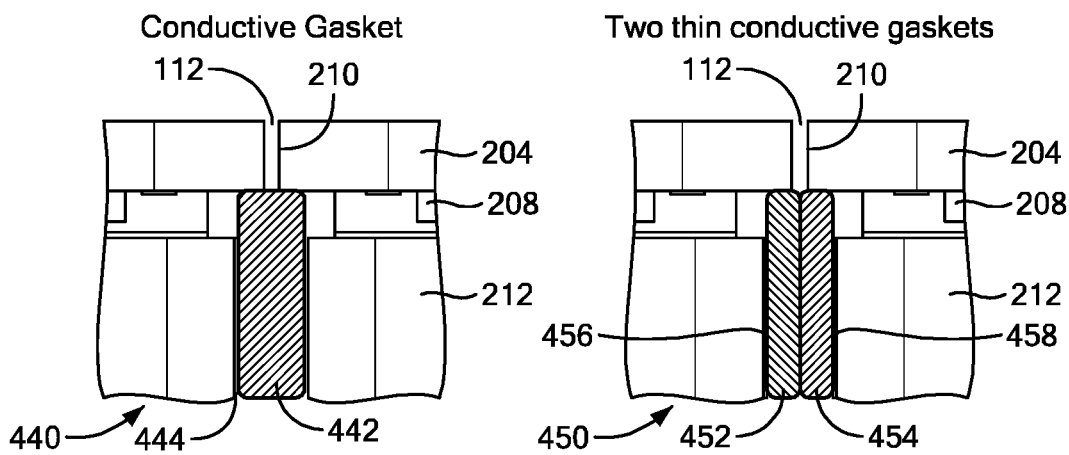
FIG. 16 is an exemplary cross sectional view of a grounding arrangement that uses a single conductive gasket, in accordance with one embodiment.
FIG. 17 is an exemplary cross sectional view of a grounding arrangement that uses two conductive gaskets, in accordance with one embodiment.

FIG. 16 is an exemplary cross sectional view 440 of a grounding arrangement that uses a single conductive gasket 442, in accordance with one embodiment. This arrangement is very similar to the approach of FIGS. 10A-10B, except that a single gasket is used. In certain embodiments, it can be applied to one or the other tiles during assembly. In addition, if desired it can be implemented to be large enough to already make contact with the conductive edges of the radiators, even without compression. Similar to the embodiment of FIGS. 10A-10B, in certain embodiments, the single conductive gasket 442 can be attached to one support structure 212 prior to or as part of assembly, using epoxy, Loctite PST, pressure sensitive adhesive (PSA), etc. The adhesive may or may not be conductive (in at least some embodiments, it is not required that the adhesive be conductive). In addition, depending on the size and assembly process, it may be possible to hold in the single conductive gasket 442 simply by compression/friction and/or via mechanical features, as noted herein.

FIG. 17 is an exemplary cross sectional view 450 of a grounding arrangement that uses two conductive gaskets, in accordance with one embodiment. This is very similar to FIGS. 10A-10B, except that the two thin conductive gaskets 454, 454, in at least some embodiments, are already making conduct even before compression. The conductive gaskets, as noted in connection with FIG. 10, can be assembled at system level or tile assembly level. In some embodiments, one gasket can be attached in one part of the procedure (e.g., tile assembly level) and the other gasket can be attached at another part of the procedure (.g., at system level). Generally, this arrangement makes contact only with the bottom of the radiators 204 and the sides of the support structures 212.

Figures 18, 19:
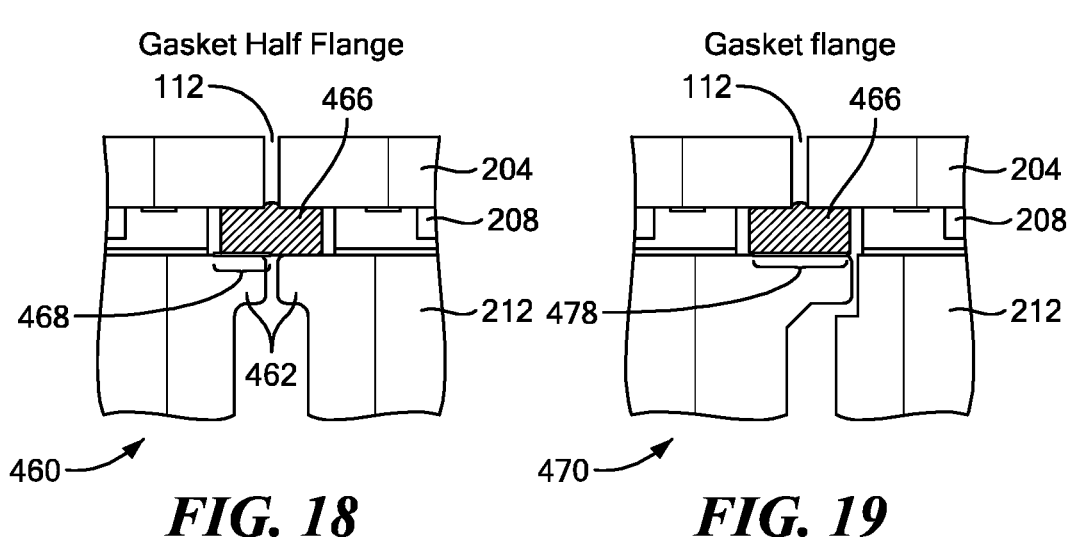
FIG. 18 is an exemplary cross sectional view of a grounding arrangement that uses a gasket half-flange, in accordance with one embodiment.
FIG. 19 is an exemplary cross sectional view of a grounding arrangement that uses a gasket flange, in accordance with one embodiment.

FIG. 18 is an exemplary cross sectional view 460 of a grounding arrangement that uses a gasket half-flange 466, in accordance with one embodiment. In this arrangement, the gasket half flange 466 can be attached, optionally, via adhesive (e.g., the same ones used in FIGS. 10A-10B) to a support structure, such as a cold plate, prior to assembly. The gasket half flange 466 can be assembled at system or tile-assembly level. As FIG. 18 shows, the gasket half flange 466 makes contact with top surfaces of the support structure 212 and bottom surfaces of the radiators 204.

FIG. 19 is an exemplary cross sectional view 470 of a grounding arrangement that uses a gasket flange 466, in accordance with one embodiment. In this arrangement, the gasket flange 466 can be attached via optional adhesive (the same ones used in FIG. 10) to a support structure 212, such as a cold plate, prior to assembly. The gasket flange 466 can be assembled at system or tile-assembly level. As FIG. 19 shows, the gasket half flange 466 makes contact with top surfaces of one of the two support structures 212 and the bottom surfaces of the radiators 204. One complexity with this embodiment is that the two support structures will not be identical, so the tile designs have to be carefully considered to avoid interference along center interface/seam 112.

Figure 20:
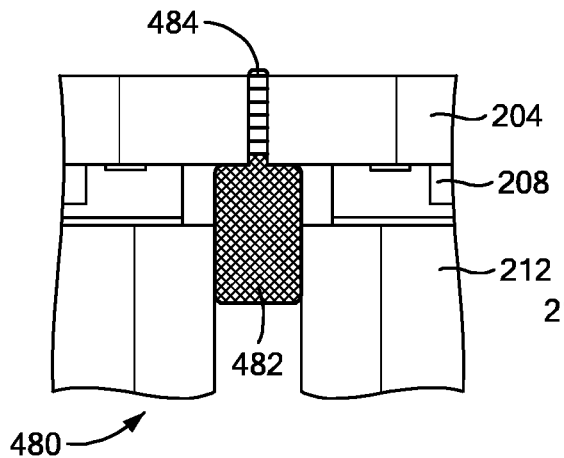
FIG. 20 is an exemplary cross sectional view of a grounding arrangement that uses a dispensable gasket with dam, in accordance with one embodiment.

FIG. 20 is an exemplary cross sectional view 480 of a grounding arrangement that uses a dispensable gasket 484 with a non-conductive or elastomeric dam 484, in accordance with one embodiment. Illustrative examples of dispensable gasket 484 material include, but are not limited to, conductive dispensable polymers, such as silicone with metallic (e.g., silver) particles mixed in. In this arrangement, the dispensable gasket 484 is conductive material (advantageously non-viscous dispensable material, to avoid it flowing too much and shorting out other parts of the assembly) that is dispensed and cured to fill the small (11 mil) gap between radiators. The conductive dispensable gasket 484 ensures the common ground connection between radiators 204, and the elastomeric, non-conductive dam provides stability and helps to limit the flow of the dispensed polymer to avoid having the dispensed polymer flow to components or regions on the circuits that should not be in electrical communication with the RF ground. The dam 482 can be attached prior to assembly, and the dispensable gasket 484 can be dispensed after assembly. Care must be taken to control the wicking of the dispensable gasket during dispense, but the elastomeric dam 482, which will already be in place, can help to reduce wicking.

Figure 21:
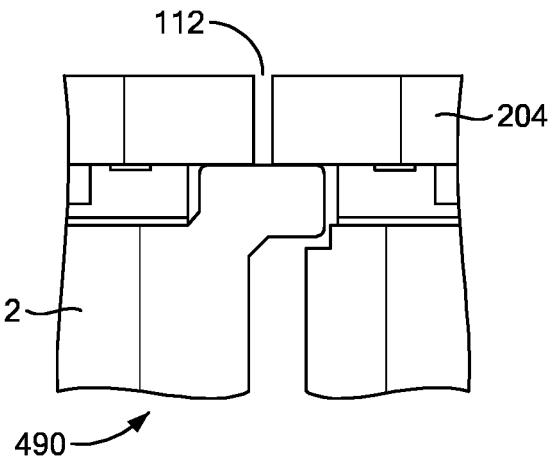
FIG. 21 is an exemplary cross sectional view of a grounding arrangement that uses direct support structure contact, in accordance with one embodiment.

FIG. 21 is an exemplary cross sectional view 490 of a grounding arrangement that uses direct support structure (for example, a cold plate but this is not limiting) contact, in accordance with one embodiment. This embodiment does not use a separate conductive grounding element. In this arrangement, at least one or both of the support structures 212 is configured to mate/connect with the other support structure and to make connect with the ground plane of the CCAs, which may be in electrical contact with the bottom surfaces of the radiators 204. In this embodiment, the support structure is configured to have an electrically conductive region applied thereon or configured to be part of its top surface (not visible in FIG. 21) which provides electrical connection between the ground planes of the first and second tiles to be joined. This arrangement can require consistently good tolerances and producibility and may be less advantageous for high frequency embodiments.

Figure 22:
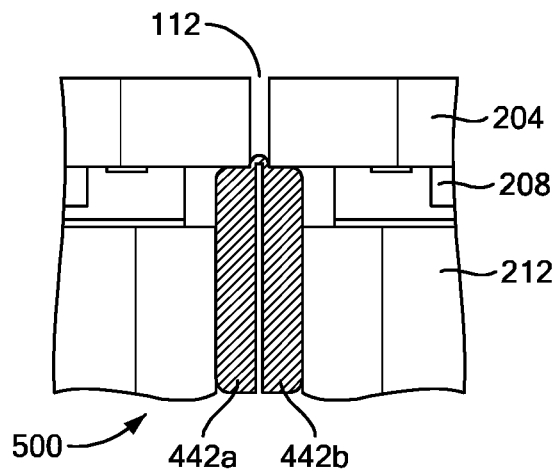
FIG. 22 is an exemplary cross sectional view of a grounding arrangement that uses a conductive gasket and wire mesh gasket, in accordance with one embodiment.

FIG. 22 is an exemplary cross sectional view 500 of a grounding arrangement that uses a conductive gasket 442a and a wire mesh gasket 442b, in accordance with one embodiment. This embodiment is similar to the embodiment of FIG. 10, but where the two gaskets 442a, 442b, are explicitly made of different materials. It can be assembled similar to the manner described in connection with the embodiment of FIG. 10, wherein each respective gasket 442a, 442b is attached to each tile side, before the tiles are assembled together.

Figure 23:
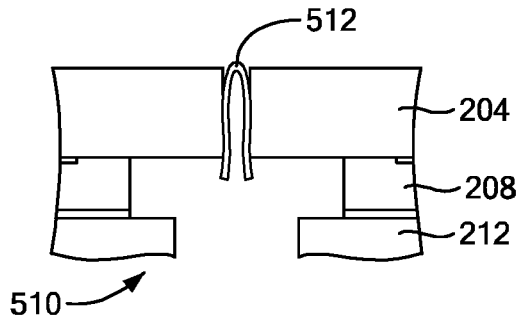
FIG. 23 is an exemplary cross sectional view of a grounding arrangement that uses a folded conductive shim, in accordance with one embodiment.

FIG. 23 is an exemplary cross sectional view 510 of a grounding arrangement that uses a folded conductive shim 512, in accordance with one embodiment. The shim 512 is configured to make both mechanical and electrical contact with the radiators 204. The shim 512 can be formed using any good electrical conductor material (e.g., gold or copper), whether alone or in combination with other materials. If the folded shim 512 is under tension, it can be easier to be held into place during assembly. For example, if the folded shim 512 were a type of spring, it could be stretched prior to assembly. Having the folded shim 512 be thin and lightweight can help to reduce the overall weight of the array, as well. In certain embodiments, the folded shim 512 can be tacked to one of the two support structures 212 during system assembly, such as with one of the optional adhesives listed in connection with FIG. 10.

Figure 24:
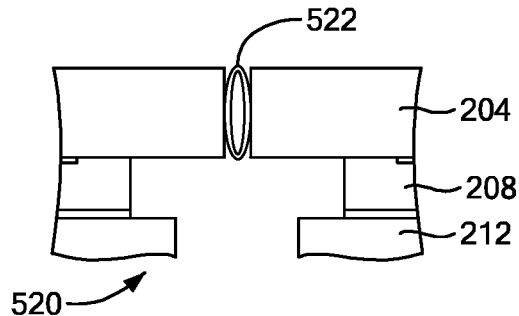
FIG. 24 is an exemplary cross sectional view of a grounding arrangement that uses a hollow structure in accordance with one embodiment.

FIG. 24 is an exemplary cross sectional view 520 of a grounding arrangement that uses a hollow conductive structure 522, in accordance with one embodiment. The hollow conductive structure 522, in certain embodiments, can be one of metal O-ring stock, syringe tubing, or a metal extrusion. In certain embodiments, the hollow conductive structure 522 can be tacked to one of the two support structures 212 during system assembly, such as with one of the optional adhesives listed in connection with FIG. 10.

Figure 25:
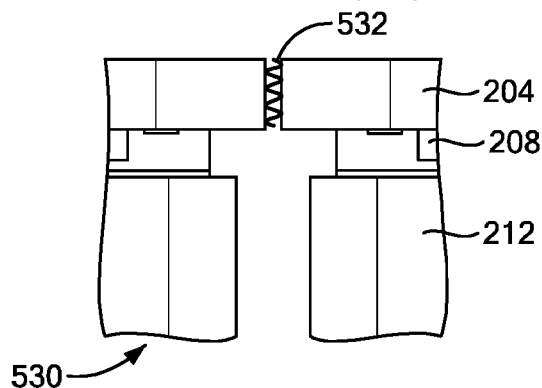
FIG. 25 is an exemplary cross sectional view of a grounding arrangement that uses a thermal spring, in accordance with one embodiment.

FIG. 25 is an exemplary cross sectional view 530 of a grounding arrangement that uses a thermal spring 532, in accordance with one embodiment. In certain embodiments, the thermal spring 532 can be a so-called Indium Heat-Spring® (available from Indium Corporation of Clinton NY). Heat-Springs® are dimpled Indium foil sheets, which can compress from 6.5 to 3.2 mils. The thermal spring 532 can be tacked to one tile radiator side during system assembly, using one of the aforementioned optional adhesives. Depending on tile size, gap 112 size, etc., before assembly, the desired size of the spring can be determined. In certain embodiments, before assembly, one of three thicknesses can be selected, to cover a range of tolerances for different tile assemblies (e.g., one of 3.2-6.5 mils, 6.4-13.0 mils, and 9.6-19.5 mils. The embodiment of FIG. 25 can be advantageous where a tile assembly requires top grounding. The thermal spring 532, in certain embodiments, can be slipped into the gap 112 after assembly, an alternative to tacking to one of the two radiators 204.

Figure 26:
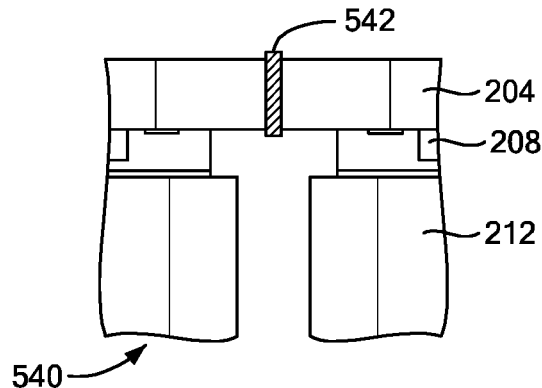
FIG. 26 is an exemplary cross sectional view of a grounding arrangement that uses a conductive shim, in accordance with one embodiment.

FIG. 26 is an exemplary cross sectional view 540 of a grounding arrangement that uses a conductive shim 542, in accordance with one embodiment. In the embodiment of FIG. 26, the conductive shim 542 is configured to be in direct electrical and mechanical contact with both radiators 204 and is sized to have a thickness to fit therebetween. In certain embodiments, for example, the conductive shim 542 to be formed using gold or copper. In certain embodiments, the conductive shim 542 is held into place during assembly (e.g., via a test fixture, manually, etc.). In certain embodiments, the conductive shim 542 can be tacked to a conductive region of a CCA associated with one radiator 204 or the other during a first stage of assembly, then later attached to a conductive region of a CCA associated with the other radiator 204. It can be challenging to pick a thickness for the conductive shim 542 that also can work with the manufacturing tolerance variations, and some trial and error may be required during assembly, along with having a large range of shim 542 thicknesses available.

Figure 27:
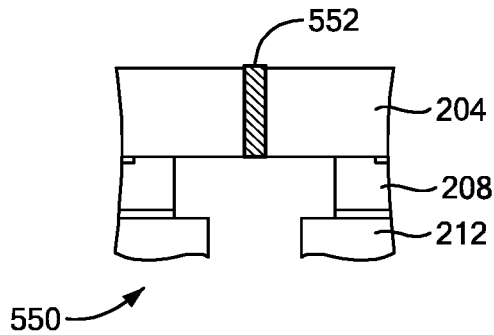
FIG. 27 is an exemplary cross sectional view of a grounding arrangement that uses a conductive shim with statistical sizing, in accordance with one embodiment.

FIG. 27 is an exemplary cross sectional view 550 of a grounding arrangement that uses a conductive shim with statistical sizing 552, in accordance with one embodiment. The arrangement of FIG. 27 is similar to that of FIG. 26, except that a different process can be used to select the size of the shim 552. The conductive material of the shim 552 is, in certain embodiments, is made using a good material such as gold or copper. In certain embodiments, it is preferable if the good conductor material also is relatively soft, to enable conforming to the gap 112. For "statistical sizing," Monte Carlo analysis or other appropriate analysis can be used to help determine the number and range of thicknesses required for the shim 552, as will be appreciated by those of skill in the art.

Figure 28:
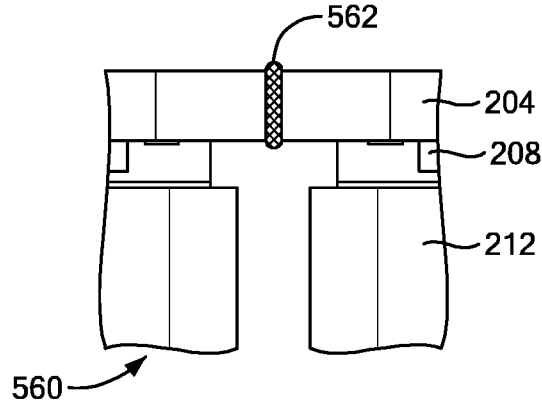
FIG. 28 is an exemplary cross sectional view of a grounding arrangement that uses a disposable conductive gasket, in accordance with one embodiment.

FIG. 28 is an exemplary cross sectional view 560 of a grounding arrangement that uses a dispensable conductive gasket 562, in accordance with one embodiment. For example, in at least some embodiments, the dispensable conductive gasket 562 can be implemented using conductive silicone or conductive epoxy. Note that, if a dispensable conductive gasket is used, in certain embodiments, such a dispensable conductive gasket need not be compressible, because the dispensable material inherently flows into the dimensional variations between modules/tiles and would stay into place once the dispensable conductive material is cured. The gasket 562 is formed using a dispensed conductive material that advantageously is not viscous, to avoid too much wicking. In certain embodiments, the dispensable conductive gasket 562 is dispensed on just one radiator 204 edge prior to assembly, then during assembly the dispensable conductive gasket makes contact with the other radiator 204. The actual squeezing out of the dispensable conductive gasket may need to be controlled to ensure that it is consistent and not variable. In addition, in some embodiments, it can be necessary to add a process step to clean the radiator surfaces of extra dispensed conductive material to avoid an issue with any short circuits caused by leftover conductive gasket material. This embodiment is another embodiment that can be useful if top grounding is required.

Figure 29:
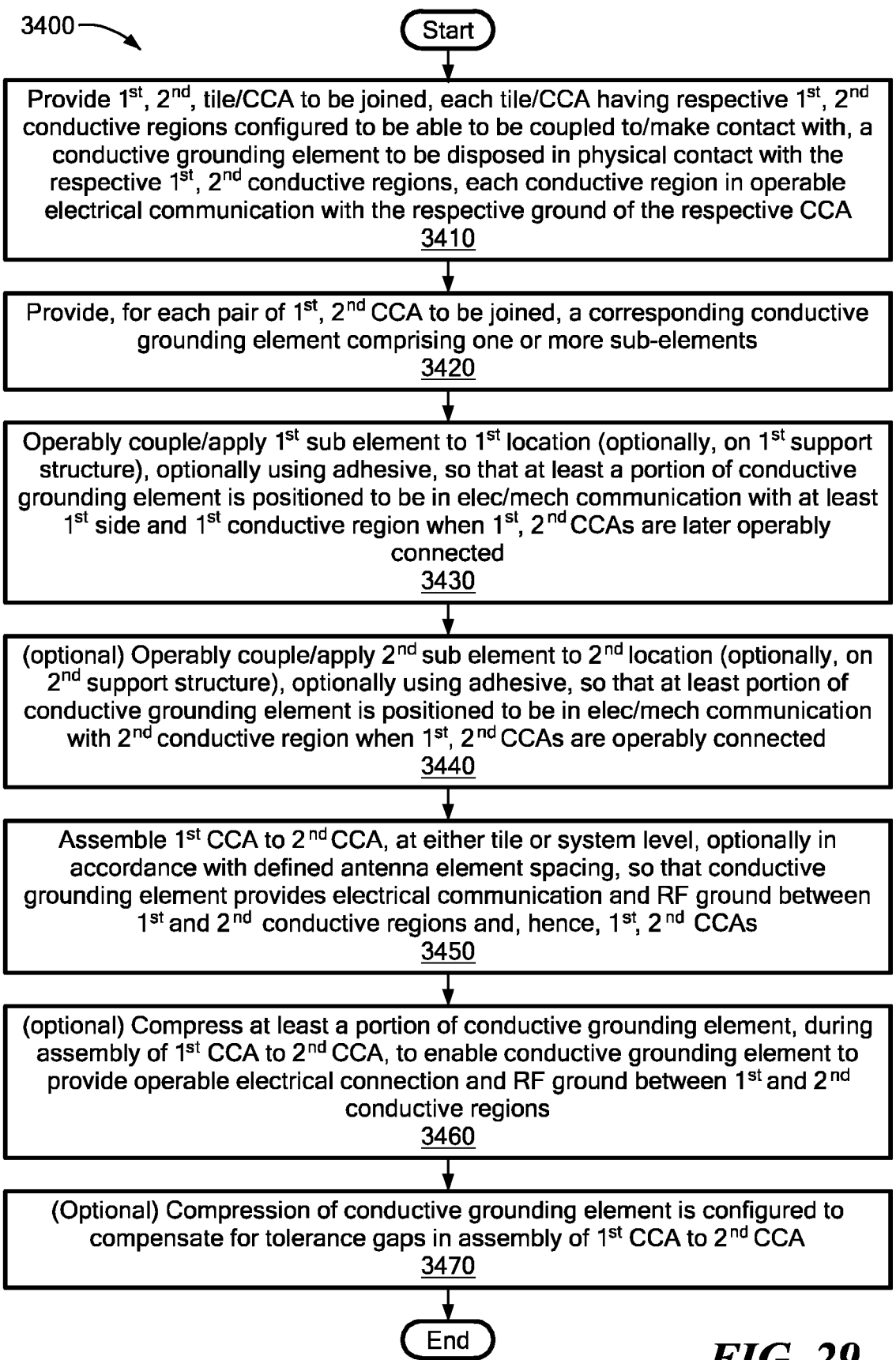
FIG. 29 is an exemplary flowchart of a process for creating a common ground plane between components, in accordance with one embodiment.

FIG. 29 is an exemplary flowchart 3400 of a process for creating and assembling a common ground plane between components, in accordance with one embodiment. This process also illustrates several optional steps that may be applicable to certain embodiments, but not all embodiments. The method of FIG. 29 is described in connection with the embodiment of FIG. 10, but those of skill in the art will readily appreciate its applicability to the various embodiments of FIGS. 14-28 as well as to any situation where two modules need to be joined to a common ground and/or where certain very tight spacings must be maintained (e.g., tight lattice spacings on antenna arrays).

Referring to FIG. 29, $1^{st}$ and $2^{nd}$ modules (e.g., CCAs) are provided to be joined (block 3410), where each CCA has a so-called "conductive region" that is in operable electrical communication with the ground plane/RF ground, of that CCA and where it is positioned/disposed to be able to be in electrical and physical contact with a conductive ground element that is to be put into electrical and physical contact with it, during assembly. For example, the conductive region, in certain embodiments, corresponds built in portion of its external surface with a connection to ground, such as an edge wrap or a ground connection on a bottom side, or both. The conductive region also can correspond to a portion of a CCA ground plane that is available to or projecting from, an edge of a board in the CCA. The conductive region also can correspond to a region in physical and/or electrical communication with one or more conductive vias of the CCA, where the conductive vias are in operable electrical communication with the CCA ground plane.

For each pair of CCAs to be joined, a conductive grounding element is provided (block 3420), where the conductive element can comprise one or more sub elements, in certain embodiments. As noted in the embodiments of FIGS. 10-28, the conductive grounding element can take many different forms, and can correspond forms such as:

a single integral piece of compressible conductive material configured to be disposed between the $1^{st}$ and $2^{nd}$ conductive regions (e.g., as in at least some embodiments of FIGS. 14-16, 18, 19, and 23-27);

two separate pieces of compressible conductive material configured to be joined during assembly (e.g., as in at least some embodiments of FIGS. 10, 17, 22);

a dispensable conductive product, which may or may not be compressible when cured, which is configured to be applied to make contact with the conductive regions during assembly (e.g., as in at least some embodiments of FIGS. 20, 28);

one or more portions of compressible conductive material that are specifically molded, shaped, configured and/or sized to fit the junction between two tiles (e.g., as in at least some embodiments of FIGS. 15, 18, 19, and 23-27);

an electrically conductive built-in or applied region on the support structures of on one or both of the tiles to be joined, made using an electrically conductive material such as a metal (e.g., as in at least some embodiments of FIG. 21).

The conductive grounding element is operably coupled (block 3430) to a first location that can enable the conductive grounding element to later be in electrical and mechanical communication with the first conductive region of the $1^{st}$ CCA to be joined, when the first and second modules are later assembled together. This first location, in certain embodiments, can correspond to a first side of the support structure (which can be a cold plate, but that is not limiting) or and/a first side of the module, etc.

For example, in connection with the embodiment of FIG. 10, the conductive grounding element comprises one or more sub elements (per block 3420) and is positioned at a first location, where in FIG. 10 the first location is along the edge 205 of the support structure 212 (for example, in certain embodiments, the edge 205 of a cold plate). This first location is one where, when the tiles 102a, 102b are later assembled, the conductive grounding element can later be in electrical and mechanical communication with at least the first conductive region of the module to be joined, which in certain embodiments is located at a bottom side of the radiator 204 (but this is not limiting) or is located along a side (edge) of the module to be joined, e.g., as noted above. In certain embodiments, the first location is on part of the support structure 212.

As applied to embodiments such as those of FIGS. 15, 15, 18, 19, and 22, the first location generally may be more limited, especially if the conductive grounding element is not going to experience significant compression that causes it to make contact with more surfaces, as in FIG. 10B.

As applied to embodiments where there is only a top conductive connection from radiator to radiator (e.g., as in FIGS. 23-28), those of skill in the art will appreciate that the action of block 3430 can be adapted as to positioning of the conductive grounding element so that it does not have to be mechanical communication with the support structure.

Referring again to the method of FIG. 29, if the conductive grounding element comprises one or more sub-elements, then optional block 3440 is performed, to position the optional $2^{nd}$ sub element in a similar way to the first sub element, e.g., so that it is in a $2^{nd}$ location, where the $2^{nd}$ location, e.g., so that it is in a $2^{nd}$ location, where the $2^{nd}$ location is one where, when the tiles 102a, 102b are later assembled, the $2^{nd}$ sub element of the conductive grounding element can later be in electrical and mechanical communication with at least the conductive region of the CCA associated with the other radiator 204, In block 3450, the $1^{st}$ and $2^{nd}$ CCAs to be joined are assembled together, at either a system or tile level, optionally having a defined spacing. In certain embodiments, the assembly is performed so that the conductive grounding element is positioned to provide electrical communication between the first and second conductive regions of the $1^{st}$ and $2^{nd}$ CCAs. In certain embodiments, in block 3450, the $1^{st}$ and $2^{nd}$ CCAs to be joined are assembled together, at either a system or tile level, optionally having or in accordance with a defined spacing (e.g., an array lattice spacing), where the assembly is performed so that the conductive grounding element is positioned to provide electrical communication between first and second conductive regions of the $1^{st}$ and $2^{nd}$ CCAs. In certain embodiments, at least one of the $1^{st}$ and $2^{nd}$ conductive edge wraps are in operable electrical communication one or more circuit ground connections and/or a circuit ground plane, e.g., disposed on each of the bottom surfaces of the $1^{st}$ and $2^{nd}$ CCAs.

In block 3460, an optional action can take place to compress at least a portion of the conductive grounding element, during assembly of the $1^{st}$ module to the $2^{nd}$ module, where the compression is configured to enable the conductive grounding element to deform slightly so as to contact more surfaces. In this case, the compression of the conductive grounding element results in providing an operable electrical and mechanical connection and RF ground between the first and second conductive regions and also helps to bridge the gap therebetween, all at the same time. This helps to provide a capability of creating a common ground plane across multiple modules, such as high frequency RF array tiles. This also helps to maintain element lattice spacing across multiple RF tiles.

The compression of at least a portion of the conductive grounding element (block 3460) can take place in any way or manner that works with the assembly process, and which is capable of slightly deforming the shape of the conductive grounding element so that it makes mechanical contact with the support structure (e.g., in certain embodiments, making mechanical contact with a support structure formed using cold plates) and a ground plane on the tile (e.g., a ground plane located at the bottom of the tile, at a conductive edge wrap, at a conductive via, etc. In one embodiment, as shown in FIGS. 10A and 10B (described previously), the support structures are able to be moved, during assembly of the two tiles together, so that the support structure slightly deforms the conductive grounding element to enable it to contact more ground surfaces in the circuit, all at once.

An added advantage, in at least certain embodiments, is optional block 3470, which recites that the compression of the conductive grounding element helps to compensate for gaps that can arise during assembly as a result of tolerance gaps (e.g., where components are out of tolerance or at the edge of the range of tolerance for that component.

It is envisioned that any or all of the embodiments described herein and/or illustrated in the Figures herein could be combined with and/or adapted to work with the technologies described in one or more of the commonly assigned U.S. patent applications and patents, including but not limited to: U.S. Pat. No. 4,208,642 ("Modular Microstrip Transmission Line Circuitry"); U.S. Pat. No. 6,611,180 ("Embedded Planar Circulator"); U.S. Pat. No. 6,624,787, entitled "Slot Coupled, Polarized, Egg-Crate Radiator"; U.S. Pat. No. 6,731,189, entitled "Multilayer stripline radio frequency circuits and interconnection methods"); U.S. Pat. No. 7,348,932 ("Tile Sub-Array and Related Techniques");

U.S. Pat. No. 9,172,145 ("Transmit/receive daughter card with integral circulator") and U.S. Pat. No. 10,541,461, entitled, "Tile for an active electronically scanned array (AESA)." The contents of the above-listed patents and published patent applications are hereby incorporated by reference.

For purposes of illustrating the present embodiments, the disclosed embodiments are described as embodied in a specific configuration and using specific arrangements, but one skilled in the art will appreciate that the device is not limited to the specific configuration but rather only by the claims included with this specification. In addition, it is expected that during the life of a patent maturing from this application, many relevant technologies will be developed, and the scopes of the corresponding terms are intended to include all such new technologies a priori.

The terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, and/or or a data signal. Within the drawings, like or related elements have like or related alpha, numeric or alphanumeric designators. Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished.

Similarly, in addition, in the Figures of this application, in some instances, a plurality of system elements may be shown as illustrative of a particular system element, and a single system element or may be shown as illustrative of a plurality of particular system elements. It should be understood that showing a plurality of a particular element is not intended to imply that a system or method implemented in accordance with the invention must comprise more than one of that element, nor is it intended by illustrating a single element that the invention is limited to embodiments having only a single one of that respective elements. In addition, the total number of elements shown for a particular system element is not intended to be limiting; those skilled in the art can recognize that the number of a particular system element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. An assembly, comprising:
a first subassembly comprising a first support structure operably coupled to a first module, the first module comprising a first ground plane, wherein the first module comprises at least a first conductive region in operable communication with the respective first ground plane;
a second subassembly comprising a second support structure operably coupled to a second module comprising a second ground plane distinct from the first ground plane, wherein the second module comprises at least a second conductive region in operable communication with the second ground plane, wherein the first and second subassemblies are configured to attach to each other along a seam; and
a conductive grounding element configured to operably couple together the first and second ground planes of the first and second subassemblies into a third common ground plane, the conductive grounding element comprising an electrically conductive material that includes a first piece disposed adjacent to a first region of the first support structure and adjacent to the first conductive region and a second piece disposed adjacent to a first region of the second support structure and adjacent to the second conductive region, wherein the first piece is configured to be disposed adjacent to the second piece during operation of the assembly, wherein the conductive grounding element comprises a material that is resilient and which has a compressibility that is operable to dynamically compensate, during operation of the assembly, for variations in at least one of a shape and a size of a gap in the seam between the first and second subassemblies, wherein a dynamic compensation, that arises from the compressibility, helps to ensure consistent spacing between the first subassembly and the second subassembly; and wherein the conductive grounding element is configured to remain resilient during operation of the assembly and is configured to fill the gap in the seam between the first and second subassemblies.

2. The assembly of claim 1, wherein the gap filling is configured to minimize a length of a grounding path between the first and second ground planes.

3. The assembly of claim 1, wherein the conductive grounding element is configured to be in compressive contact with the first region of the first support structure, the first region of the second support structure, the first conductive region, and the second conductive region.

4. The assembly of claim 1, wherein the conductive grounding element comprises at least one of a dispensed electrically conductive material, a compressible electrically conductive material, and an electrically conductive polymer material.

5. The assembly of claim 1, wherein at least one of the first and second modules comprises a plurality of antenna elements.

6. The assembly of claim 5, wherein the plurality of antenna elements is arranged in a first lattice pattern having a first spacing and wherein the conductive grounding element is configured to maintain a continuity of the first spacing across the seam.

7. The assembly of claim 1, wherein the first piece and the second piece of the conductive grounding element comprise distinct and separate adjacent structures that are configured to be in operable mechanical and electrical communication when the first subassembly, second subassembly, and conductive grounding element, are assembled together into the assembly.

8. The assembly of claim 1, wherein the first subassembly comprises a first antenna tile and the second subassembly comprises a second antenna tile.

9. The assembly of claim 1, wherein at least one of the first and second subassemblies comprises an opening and wherein the first piece and the second piece of the conductive grounding element together form a T shape having has at least a portion configured to mate to the opening so as to enable secure attachment of the conductive grounding element to at least one of the first and second subassemblies.

10. A method, comprising:
providing a first subassembly comprising a first support structure operably coupled to a first module, the first module comprising a first ground plane, wherein the first module comprises at least a first conductive region in operable communication with the first ground plane;
providing a second subassembly comprising a second support structure operably coupled to a second module comprising a second ground plane distinct from the first ground plane, wherein the second module comprises at least a second conductive region in operable communication with the second ground plane, wherein the first and second subassemblies are configured to attach to each other along a seam; and
coupling the first and second subassemblies together into an assembly using a conductive grounding element configured to operably couple together the first and second ground planes of the first and second subassemblies into a third common ground plane, the conductive grounding element comprising an electrically conductive material that includes a first piece disposed adjacent to a first region of the first support structure and adjacent to the first conductive region and a second piece disposed adjacent to a first region of the second support structure and adjacent to the second conductive region, wherein the first piece is configured to be disposed adjacent to the second piece during operation of the assembly, wherein the conductive grounding element comprises a material that is resilient and which has a compressibility that is operable to dynamically compensate, during operation of the assembly, for variations in at least one of a shape and a size of a gap in the seam between the first and second subassemblies, wherein a dynamic compensation, that arises from the compressibility, helps to ensure consistent spacing between the first subassembly and the second subassembly, and wherein the conductive grounding element is configured to remain resilient during operation of the assembly and is configured to fill the gap in the seam between the first and second subassemblies.

11. The method of claim 10, further comprising configuring the conductive grounding element to minimize a length of a grounding path between the first and second ground planes.

12. The method of claim 10, wherein at least one of the first and second modules comprises a plurality of antenna elements arranged in a first lattice pattern having a first spacing, wherein the conductive grounding element is configured to maintain a continuity of the first spacing across the seam.

13. The method of claim 10, wherein the conductive grounding element is configured to be in compressive contact with the first region of the first support structure, the first region of the second support structure, the first conductive region, and the second conductive region.

14. The method of claim 10, wherein the conductive grounding element comprises at least one of a dispensed electrically conductive material, a compressible electrically conductive material, and an electrically conductive polymer material.

15. The method of claim 10, wherein the method further comprises applying compression to the conductive grounding element, wherein the compression is configured to deform a shape of the conductive grounding element enough to cause the first piece to make electrical contact with the first region of the first support structure and to cause the second piece to make electrical contact with the first region of the second support structure, whereby the first ground plane and second ground plane are coupled together into the third common ground plane.

16. An assembly, comprising:
a first subassembly comprising a first module having a first ground plane, wherein the first module comprises at least a first conductive region in operable communication with the first ground plane;
a second subassembly comprising a second module having a second ground plane distinct from the first ground plane, wherein the second module comprises at least a second conductive region in operable communication with the second ground plane, wherein the first and second subassemblies are configured to attach to each other along a seam; and
a conductive grounding element configured to operably couple together the first and second ground planes of the first and second subassemblies into a third common ground plane, the conductive grounding element comprising an electrically conductive material that includes a first piece disposed adjacent to the first conductive region and a second piece disposed adjacent the second conductive region, wherein the first piece is configured to be disposed adjacent to the second piece during operation of the assembly, wherein the conductive grounding element comprises a material that is resilient and which has a compressibility that is operable to dynamically compensate, during operation of the assembly, for variations in at least one of a shape and a size of a gap in the seam between the first and second subassemblies, wherein a dynamic compensation, that arises from the compressibility, helps to ensure consistent spacing between the first subassembly and the second subassembly; and wherein the conductive grounding element is configured to remain resilient during operation of the assembly and is configured to fill the gap in the seam between the first and second subassemblies.

17. The assembly of claim 16, wherein the gap filling is configured to minimize a length of a grounding path between the first and second ground planes.

18. The assembly of claim 16, wherein the first and second modules each comprise a respective plurality of antenna elements is arranged in a first lattice pattern having a first spacing and wherein the conductive grounding element is configured to maintain a continuity of the first spacing across the seam.

19. The assembly of claim 16, wherein at least one of the first and second subassemblies comprises an opening and wherein the first piece and the second piece of the conductive grounding element together form a T shape having at least a portion configured to mate to the opening so as to enable secure attachment of the conductive grounding element to at least one of the first and second subassemblies.

20. The assembly of claim 16, wherein the conductive grounding element comprises at least one of a dispensed electrically conductive material, an electrically conductive polymer material, and a compressible electrically conductive material.

* * * * *